United States Patent
Sharma et al.

(10) Patent No.: US 11,362,215 B2
(45) Date of Patent: Jun. 14, 2022

(54) TOP-GATE DOPED THIN FILM TRANSISTOR

(71) Applicant: Intel Corporation, Santa Clara, CA (US)

(72) Inventors: Abhishek A. Sharma, Hillsboro, OR (US); Sean T. Ma, Portland, OR (US); Van H. Le, Portland, OR (US); Jack T. Kavalieros, Portland, OR (US); Gilbert Dewey, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 927 days.

(21) Appl. No.: 15/942,169

(22) Filed: Mar. 30, 2018

(65) Prior Publication Data
US 2019/0305138 A1  Oct. 3, 2019

(51) Int. Cl.
H01L 29/786 (2006.01)
H01L 29/66 (2006.01)
H01L 29/06 (2006.01)
H01L 29/423 (2006.01)
H01L 29/49 (2006.01)

(52) U.S. Cl.
CPC .... *H01L 29/78675* (2013.01); *H01L 29/0649* (2013.01); *H01L 29/42364* (2013.01); *H01L 29/42384* (2013.01); *H01L 29/4908* (2013.01); *H01L 29/66545* (2013.01); *H01L 29/66742* (2013.01); *H01L 29/66757* (2013.01); *H01L 29/66969* (2013.01); *H01L 29/7869* (2013.01); *H01L 29/78666* (2013.01); *H01L 29/78681* (2013.01); *H01L 29/78684* (2013.01); *H01L 29/78696* (2013.01)

(58) Field of Classification Search
CPC ........ H01L 29/78696; H01L 29/78675; H01L 29/66545; H01L 29/42384; H01L 29/66757; H01L 29/66742; H01L 29/4908
See application file for complete search history.

(56) References Cited

U.S. PATENT DOCUMENTS 5,292,675 A * 3/1994 Codama ............ H01L 29/66598
                                                           438/163
5,468,987 A * 11/1995 Yamazaki ......... H01L 21/76897
                                                           257/412

(Continued)

FOREIGN PATENT DOCUMENTS

JP    S63-47980 A  *  2/1988  ........... H01L 29/786

OTHER PUBLICATIONS

Machine translation, Hiranaka, Japanese Pat. Pub. No. JP S63-47980A, translation date: May 4, 2021, Espacenet, all pages. (Year: 2021).*

*Primary Examiner* — Victoria K. Hall
(74) *Attorney, Agent, or Firm* — Finch & Maloney PLLC

(57) ABSTRACT

Described is a thin film transistor which comprises: a dielectric comprising a dielectric material; a first structure adjacent to the dielectric, the first structure comprising a first material; a second structure adjacent to the first structure, the second structure comprising a second material wherein the second material is doped; a second dielectric adjacent to the second structure; a gate comprising a metal adjacent to the second dielectric; a spacer partially adjacent to the gate and the second dielectric; and a contact adjacent to the spacer.

21 Claims, 17 Drawing Sheets

(56) References Cited

U.S. PATENT DOCUMENTS

| | | | | |
|---|---|---|---|---|
| 5,717,223 | A * | 2/1998 | Hack | H01L 27/12 257/57 |
| 5,904,508 | A * | 5/1999 | Codama | H01L 29/42384 438/151 |
| 6,444,390 | B1 * | 9/2002 | Yamazaki | H01L 27/12 257/E21.413 |
| 6,518,134 | B2 * | 2/2003 | Yang | H01L 21/76264 257/E21.413 |
| 8,346,954 | B2 * | 1/2013 | Roe | H04L 12/2832 709/230 |
| 8,707,131 | B2 * | 4/2014 | Szapiro | H03M 13/3776 714/763 |
| 8,762,543 | B2 * | 6/2014 | Yao | H04W 76/14 709/227 |
| 8,972,698 | B2 * | 3/2015 | Hughes | G06F 9/30018 712/7 |
| 9,037,840 | B2 * | 5/2015 | Varma | G06F 1/3206 713/1 |
| 9,104,542 | B2 * | 8/2015 | Szapiro | G06F 11/1064 |
| 9,284,045 | B1 * | 3/2016 | Springer | B64D 43/00 |
| 9,448,867 | B2 * | 9/2016 | Datta | G06F 11/0754 |
| 9,485,628 | B2 * | 11/2016 | Lee | H04W 4/33 |
| 9,503,966 | B2 * | 11/2016 | Ong | H04W 48/10 |
| 9,524,263 | B2 * | 12/2016 | Chappell | G06F 9/52 |
| 10,090,415 | B1 * | 10/2018 | Hekmatshoartabari | H01L 21/02595 |
| 2001/0048107 | A1 * | 12/2001 | Lyu | H01L 27/12 257/72 |
| 2002/0033485 | A1 * | 3/2002 | Morosawa | H01L 29/78621 257/72 |
| 2002/0121639 | A1 * | 9/2002 | So | H01L 27/1288 257/72 |
| 2002/0123201 | A1 * | 9/2002 | So | H01L 27/1214 438/373 |
| 2004/0132293 | A1 * | 7/2004 | Takayama | H01L 21/02691 438/689 |
| 2005/0258488 | A1 * | 11/2005 | Chang | H01L 29/78621 257/347 |
| 2006/0040432 | A1 * | 2/2006 | Glasse | H01L 29/66757 438/151 |
| 2006/0071352 | A1 * | 4/2006 | Glasse | H01L 21/28079 257/213 |
| 2007/0295976 | A1 * | 12/2007 | Katou | H01L 29/78621 257/93 |
| 2008/0049159 | A1 * | 2/2008 | Tsaur | G02F 1/13439 349/47 |
| 2008/0067516 | A1 * | 3/2008 | Caligiore | H01L 29/66757 257/66 |
| 2009/0244412 | A1 * | 10/2009 | Tsukagoshi | G03B 21/006 349/8 |
| 2009/0283763 | A1 * | 11/2009 | Park | H01L 29/66969 257/43 |
| 2010/0051959 | A1 * | 3/2010 | Moriwaki | H01L 29/42384 257/72 |
| 2010/0113091 | A1 * | 5/2010 | Sharma | G06K 9/38 455/556.1 |
| 2010/0155793 | A1 * | 6/2010 | Do | H01L 29/66545 257/288 |
| 2011/0145421 | A1 * | 6/2011 | Yao | H04W 76/14 709/228 |
| 2011/0315980 | A1 * | 12/2011 | Kim | H01L 29/78696 257/43 |
| 2012/0196572 | A1 * | 8/2012 | Zellner | H04W 4/02 455/411 |
| 2012/0223303 | A1 * | 9/2012 | Ye | H01L 29/42384 257/43 |
| 2014/0009421 | A1 * | 1/2014 | Lee | G06F 21/31 345/173 |
| 2014/0122839 | A1 * | 5/2014 | Wolrich | G06F 9/3885 712/223 |
| 2015/0365913 | A1 * | 12/2015 | Aldana | H04W 64/006 370/252 |
| 2016/0093652 | A1 * | 3/2016 | Ikeda | H02S 40/44 250/208.1 |
| 2016/0097731 | A1 * | 4/2016 | Usagawa | G01N 27/4148 73/31.06 |
| 2016/0118425 | A1 * | 4/2016 | Kurokawa | H01L 27/1225 257/43 |
| 2016/0343866 | A1 * | 11/2016 | Koezuka | H01L 21/465 |
| 2016/0343868 | A1 * | 11/2016 | Koezuka | H01L 29/7869 |
| 2017/0162710 | A1 * | 6/2017 | Shih | H01L 29/78693 |
| 2017/0186324 | A1 * | 6/2017 | Fish | G06Q 30/018 |
| 2017/0229584 | A1 * | 8/2017 | Okada | H01L 21/02554 |
| 2017/0294459 | A1 * | 10/2017 | Lee | H01L 29/78696 |
| 2017/0302641 | A1 * | 10/2017 | Ramatchandirane | G06Q 20/123 |
| 2017/0338108 | A1 * | 11/2017 | Yamazaki | H01L 29/78648 |
| 2018/0012739 | A1 * | 1/2018 | Yamazaki | H01L 27/127 |
| 2018/0012910 | A1 * | 1/2018 | Yamazaki | H01L 29/78696 |
| 2018/0013002 | A1 * | 1/2018 | Yamazaki | H01L 29/78696 |
| 2018/0025905 | A1 * | 1/2018 | Yamazaki | H01L 27/04 438/467 |
| 2018/0082843 | A1 * | 3/2018 | Isogai | H01L 29/78696 |
| 2018/0083142 | A1 * | 3/2018 | Chi | H01L 27/1222 |
| 2018/0122833 | A1 * | 5/2018 | Lee | H01L 29/26 |
| 2018/0158843 | A1 * | 6/2018 | Lius | H01L 27/1255 |
| 2018/0170242 | A1 * | 6/2018 | Wang | H04L 67/125 |
| 2018/0190830 | A1 * | 7/2018 | Ren | H01L 29/78603 |
| 2018/0219097 | A1 * | 8/2018 | Orui | H01L 21/0257 |
| 2019/0043963 | A1 * | 2/2019 | Baars | H01L 29/78654 |
| 2019/0214485 | A1 * | 7/2019 | Wang | H01L 21/32105 |
| 2019/0305133 | A1 * | 10/2019 | Sharma | H01L 29/7869 |
| 2019/0326443 | A1 * | 10/2019 | Suzuki | H01L 29/247 |
| 2019/0355725 | A1 * | 11/2019 | Le | H01L 29/42384 |
| 2020/0335635 | A1 * | 10/2020 | Sharma | H01L 29/42384 |

* cited by examiner

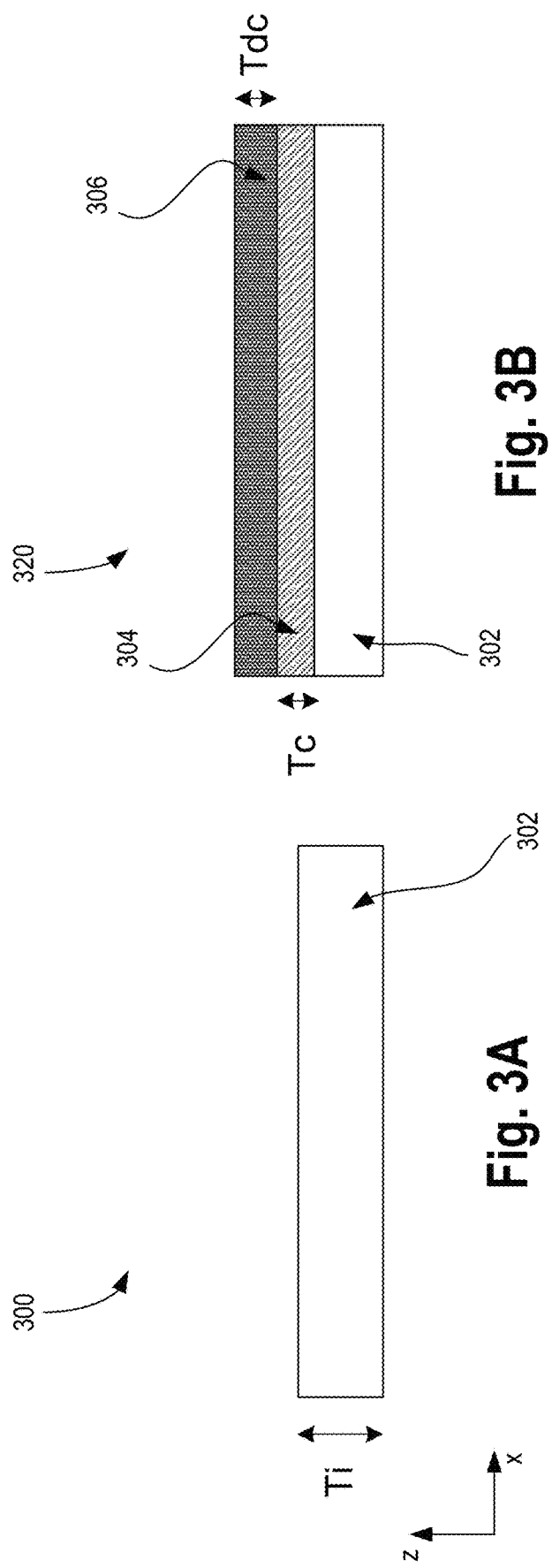

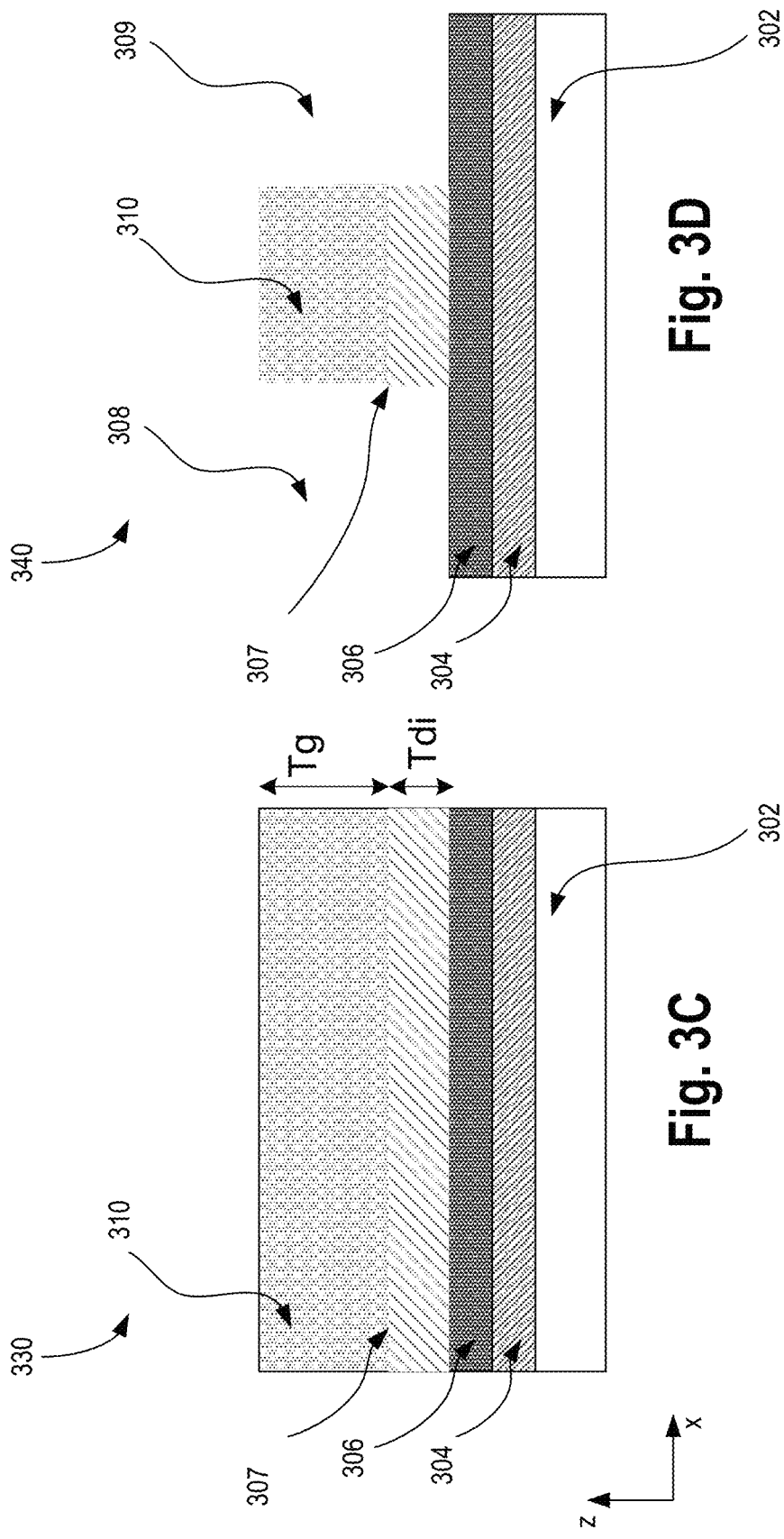

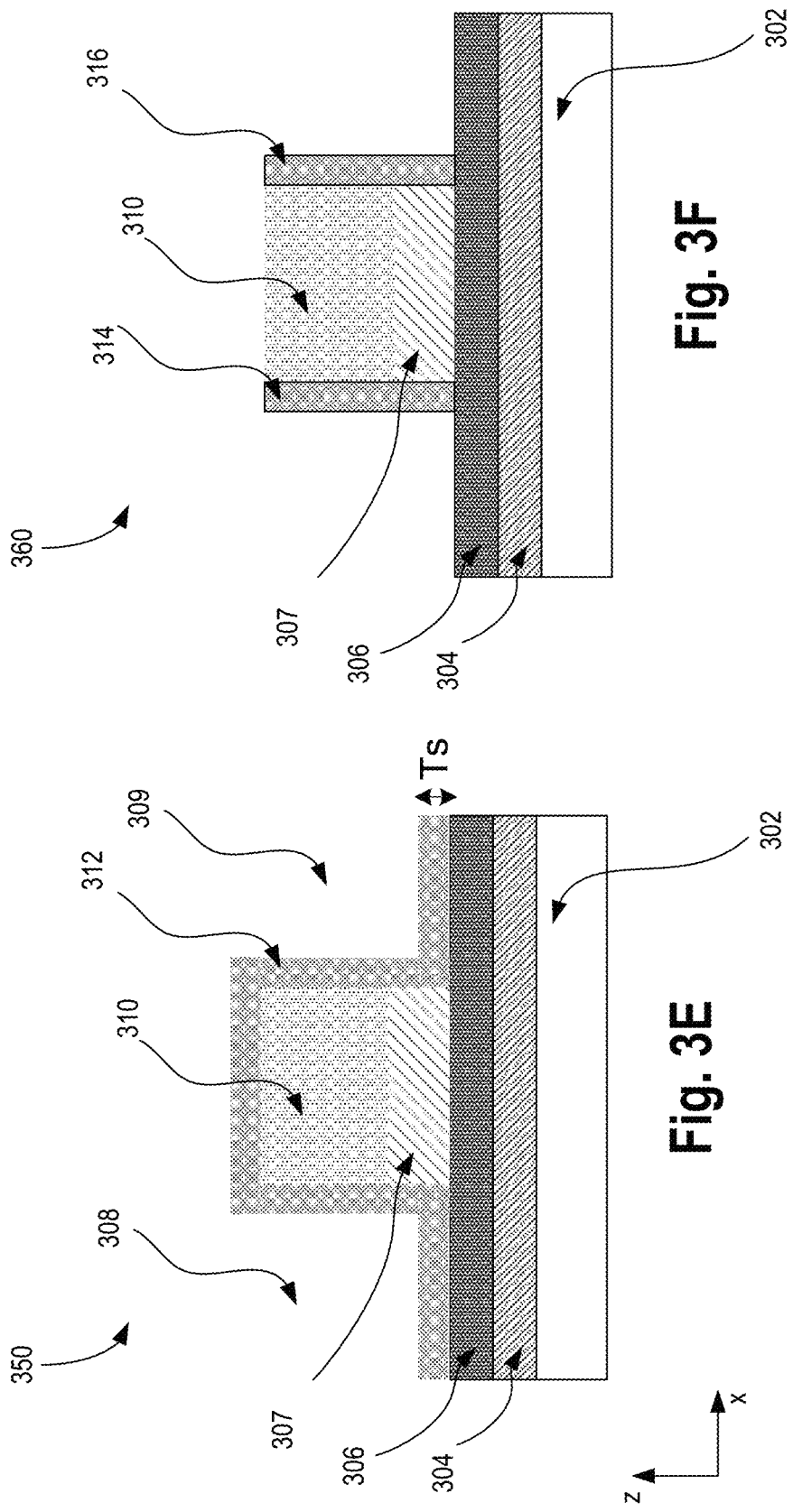

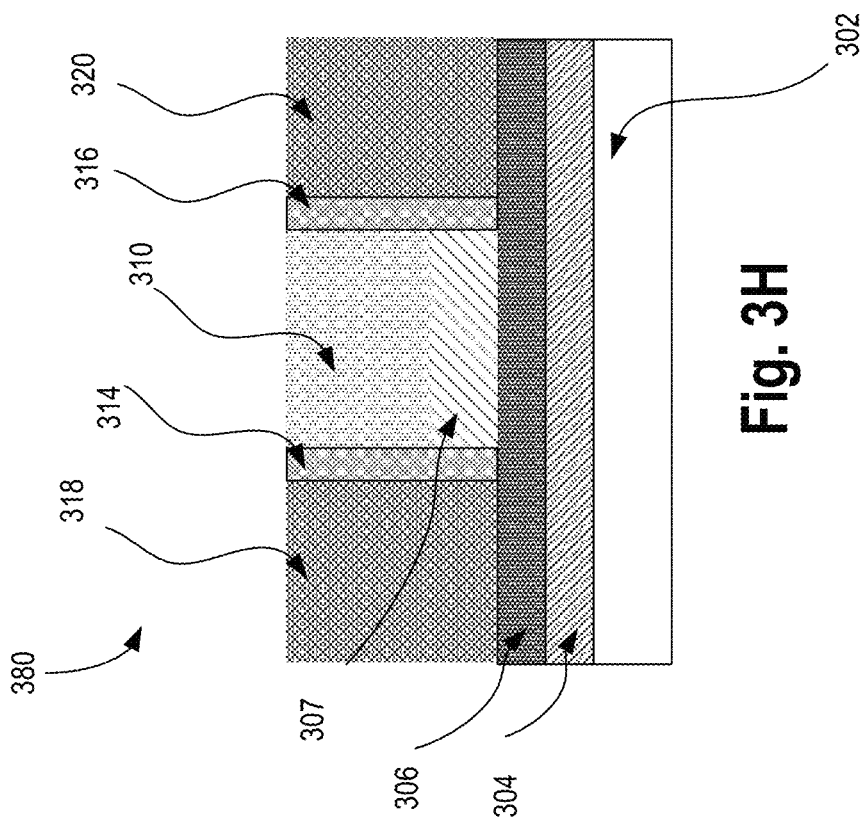
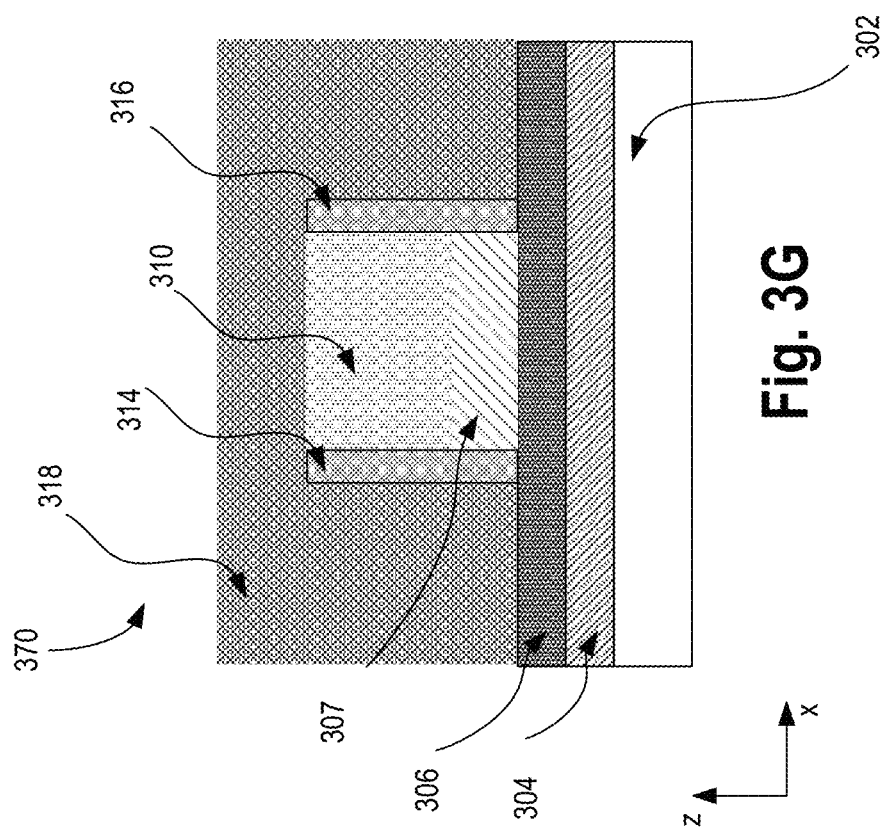

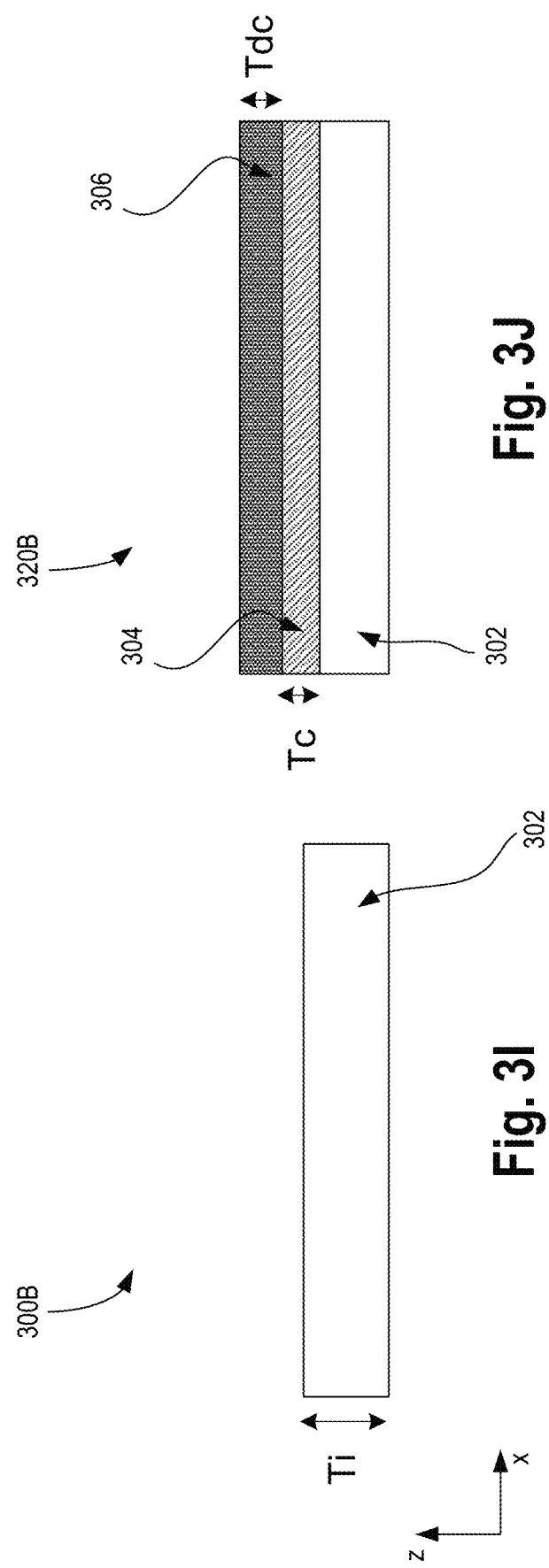

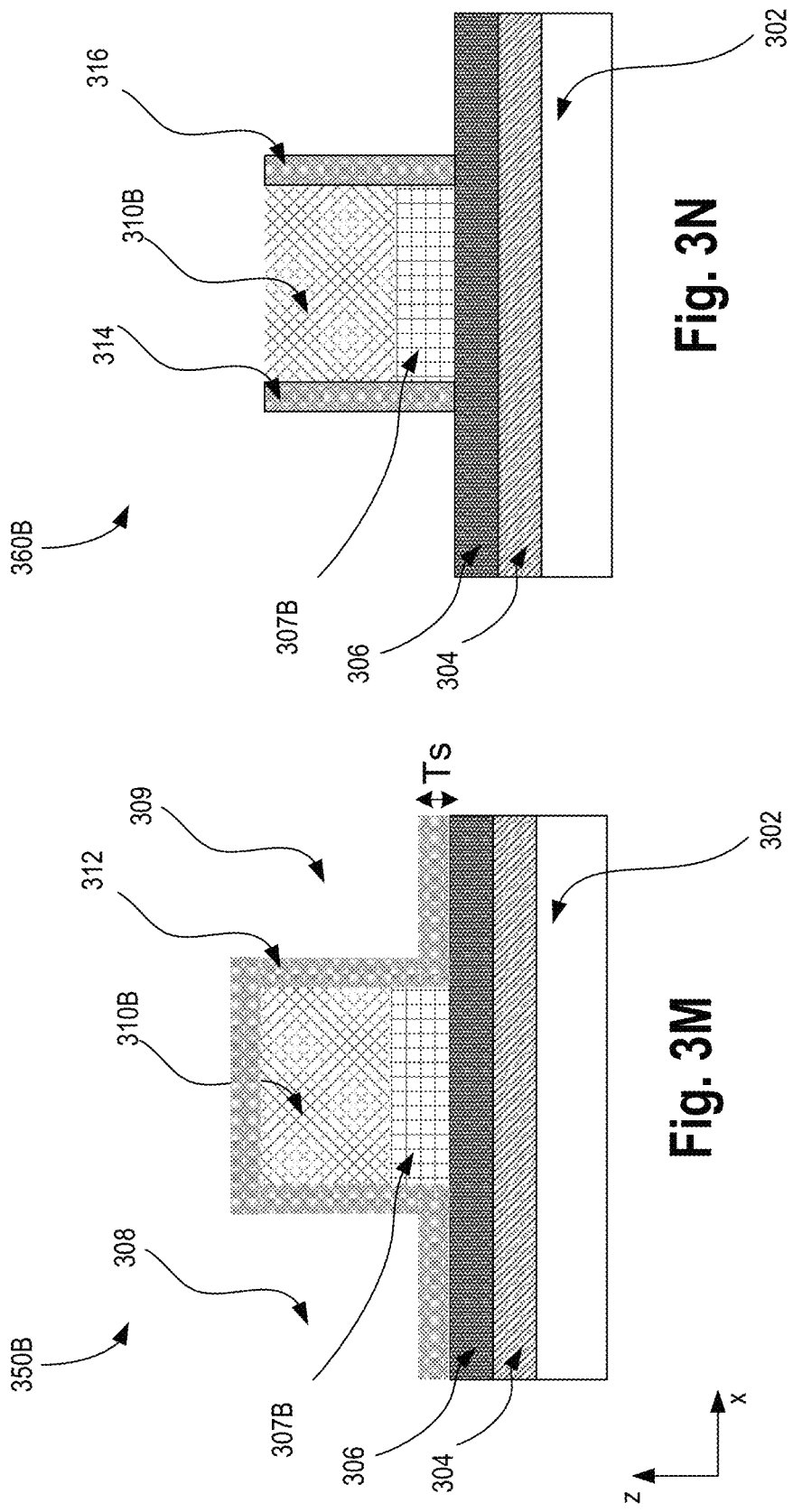

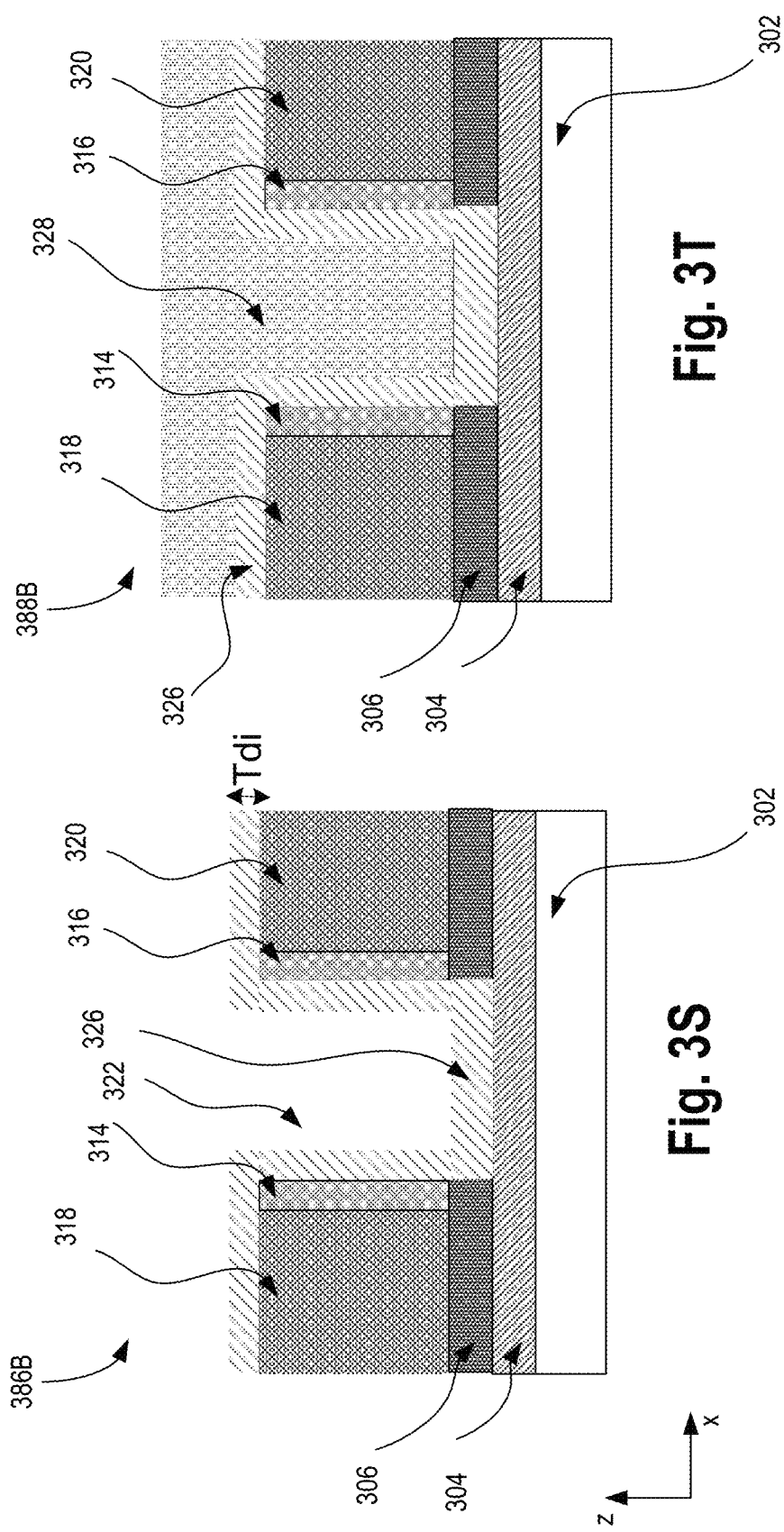

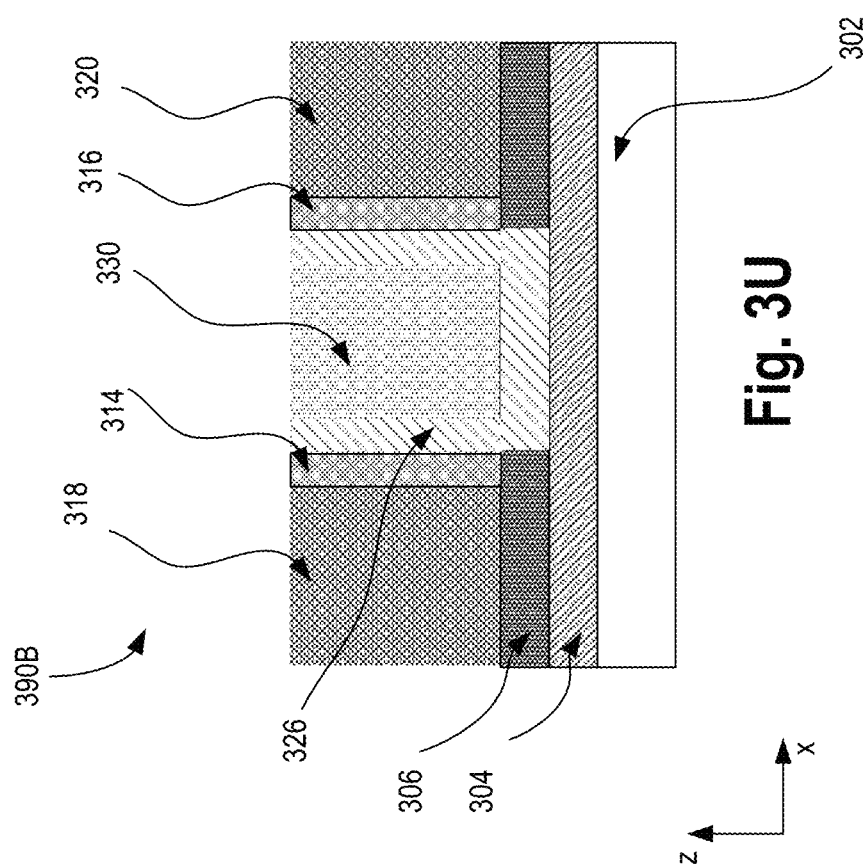

TOP-GATE DOPED THIN FILM TRANSISTOR

BACKGROUND

Generally, transistors are an important basis of modern electronics. Thin-film transistors (TFTs) are a class of field-effect transistors (FETs) in which the channel semiconductor material is a deposited amorphous or polycrystalline thin film rather than a monocrystalline material. A common application of TFT technology is liquid crystal displays (LCDs), but TFTs are also advantageous in other applications as the thin film deposition processes employed in TFT fabrication can be relatively low (e.g., below 450° C.), allowing TFTs to be inserted within layers of interconnect metallization of the type that is typically formed only after higher-temperature processing is completed in conventional silicon MOSFET fabrication technology. However, TFTs when in the top-gate configuration suffer from contact resistance. It may be useful to reduce a contact resistance of a TFT.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 3A-3H illustrate cross-sectional views of the process of forming the top-gated TFT, in accordance with some embodiments;

FIGS. 3I-3U illustrate cross-sectional views of the process of forming the top-gated TFT, in accordance with some alternative embodiments;

DETAILED DESCRIPTION

Figure 1A:
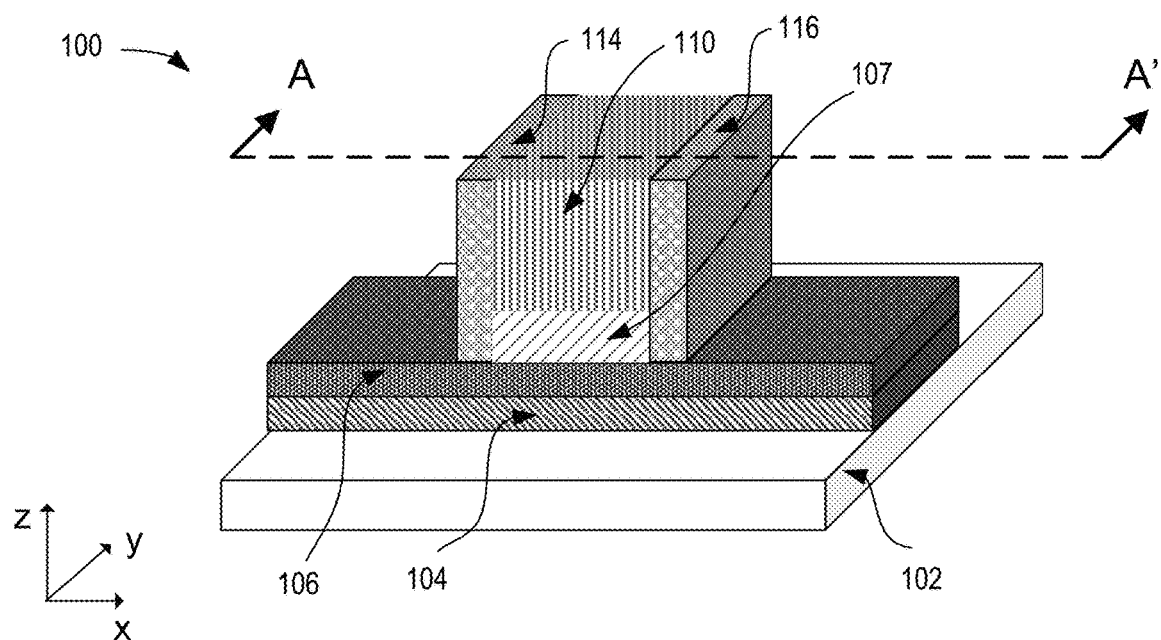
FIG. 1A illustrates a three dimensional (3D) plan view of a top-gate thin film transistor (TFT), in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal.

The term "adjacent" here generally refers to a position of a thing being next to (e.g., immediately next to or close to with one or more things between them) or adjoining another thing (e.g., abutting it).

The meaning of "a," "an," and "the" include plural references. The meaning of "in" includes "in" and "on."

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material "on" a second material is in direct contact with that second material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

It is pointed out that those elements of a figure having the same reference numbers (or names) as the elements of any other figure can operate or function in any manner similar to that described, but are not limited to such.

Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

Top-gate thin film transistor (TFTs) structures are described herein. Thin film transistors when in the top-gate configuration suffer from contact resistance. The embodiments of the current invention introduce a sheet of doping on the top surface of TFT channel material. The doping on the top surface of the TFT channel material results in improved contacts resistance.

In some embodiments, the top-gate TFT comprises: a dielectric comprising a dielectric material; a first structure adjacent to the dielectric, the first structure comprising a first material; a second structure adjacent to the first structure, the second structure comprising a second material wherein the second material is doped; a second dielectric adjacent to the second structure; a gate comprising a metal adjacent to the second dielectric; a spacer partially adjacent to the gate and the second dielectric; and a contact adjacent to the spacer. In some embodiments, the dielectrics material includes one or more of: porous $SiO_2$, fluorine-doped $SiO_2$, carbon-doped $SiO_2$, porous-doped $SiO_2$, spin-on silicon based polymeric dielectric, or spin-on organic polymeric dielectric. In some embodiments, the dielectrics material includes one or more of: Si, O, C, F, Hf, Zr, Al, N, Ta, Ti, Y, or La.

In some embodiments, the first material includes one or more of: In, Ga, Zn, O, Y, Sn, Ge, Si, Mo, Se, W, S, Te, Cu, Co, Nb, Ni, or Al. In some embodiments, the second material includes one or more of: In, Ga, Zn, O, Y, Sn, Ge, Si, Mo, Se, W, S, Te, Cu, Co, Nb, Ni, or Al. In some embodiments, the second material is doped with one or more of: N, CHF3, CH3F, Cl2, Cl, F, F2, O2, N2O, NF3, or BCl3. In some embodiments, the second material is doped with one or more of: O, F, H, Br, N, C, Cl, or B. In some embodiments, the second dielectric material is a high-K dielectric material which includes one or more of: Hf, Si, O, Zr, Al, N, Ta, Ti, Y, La, or C.

In some embodiments the spacer includes one or more of: Hf, Si, O, Zr, Al, N, Ta, Ti, Y, La, or C. In some embodiments, the first structure has a thickness in a range of 10-1000 Angstrom. In some embodiments, the second structure has a thickness in a range of 10-400 Angstrom. In some embodiments, the gate has a thickness in a range of 5 nm to 20 nm. In some embodiments, the metal of the gate includes one or more of: Ti, N, Ta, W, C, Pt, Cr, Hf, Ir, Ru, Mo, In, O, Al, Zn, Cu, or Au. In some embodiments, the contact includes one or more of: Ti, N, Ta, W, C, Pt, Cr, Hf, Ir, Ru, Mo, In, O, Al, Zn, Cu, or Au.

In some embodiments, the top-gate TFT comprises: a dielectric comprising a dielectric material; a first structure adjacent to the dielectric, the first structure comprising a first material; a second structure adjacent to the first structure, the second structure comprising a second material wherein the second material is partially doped; a second dielectric adjacent to the non-doped portion of the second structure; a gate comprising a metal adjacent to the second dielectric; a spacer partially adjacent to the gate and the second dielectric; and a contact adjacent to the spacer. In some embodiments, the dielectric material includes one or more of: porous Si 02, fluorine-doped SiO2, carbon-doped SiO2, porous-doped SiO2, spin-on silicon based polymeric dielectric, spin-on organic polymeric dielectric. In some embodiments, the dielectrics material includes one or more of: Si, 0, C, F, Hf, Zr, Al, N, Ta, Ti, Y, or La. In some embodiments, the first material includes one or more of: In, Ga, Zn, 0, Y, Sn, Ge, Si, Mo, Se, W, S, Te, Cu, Co, Nb, Ni, or Al. In some embodiments, the second material includes one or more of: In, Ga, Zn, 0, Y, Sn, Ge, Si, Mo, Se, W, S, Te, Cu, Co, Nb, Ni, or Al. In some embodiments, the second material is doped with one or more of: N, CHF3, CH3F, Cl2, Cl, F, F2, O2, N2O, NF3, or BCl3. In some embodiments, the second material is doped with one or more of: 0, F, H, Br, N, or C, Cl, or B. In some embodiments, the second dielectric material is a high-K dielectric material which includes one or more of: Hf, Si, 0, Zr, Al, N, Ta, Ti, Y, La, or C. In some embodiments the spacer includes one or more of: Hf, Si, 0, Zr, Al, N, Ta, Ti, Y, La, or C. In some embodiments, the first structure has a thickness in a range of 10-1000 Angstrom. In some embodiments, the second structure has a thickness in a range of 10-400 Angstrom. In some embodiments, the gate has a thickness in a range of 5 nm to 20 nm. In some embodiments, the metal of the gate includes one or more of: Ti, N, Ta, W, C, Pt, Cr, Hf, Ir, Ru, Mo, In, 0, Al, Zn, Cu, or Au. In some embodiments, the contact includes one or more of: Ti, N, Ta, W, C, Pt, Cr, Hf, Ir, Ru, Mo, In, 0, Al, Zn, Cu, or Au.

Figure 2A:
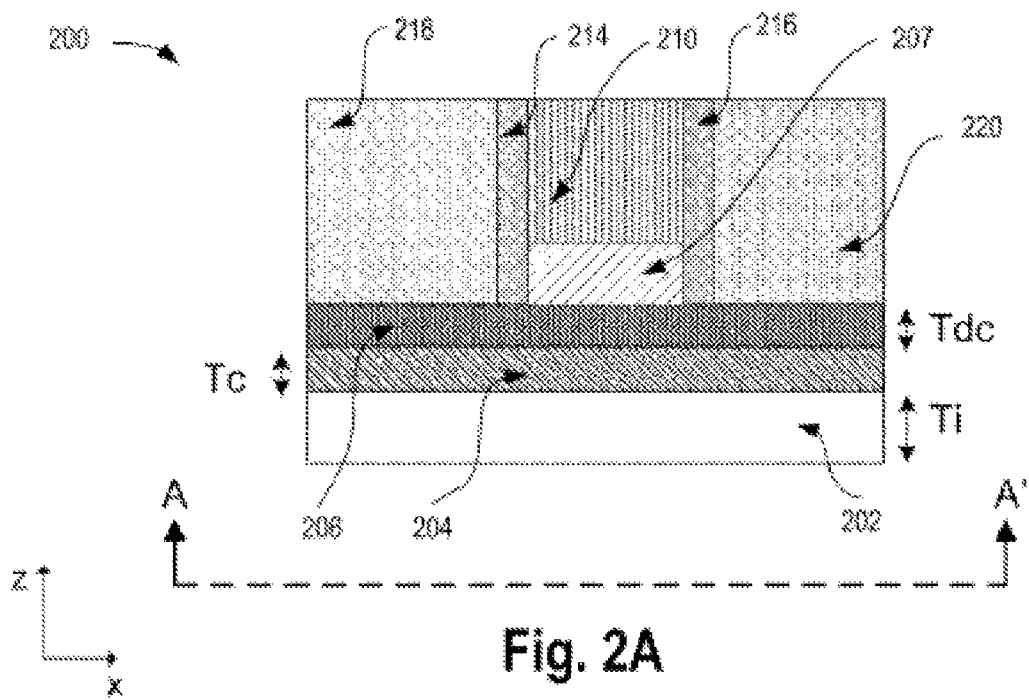
FIG. 2A illustrates a cross-sectional side view of the top-gate TFT structure of FIG. 1, in accordance with some embodiments.

FIG. 1A illustrates a three dimensional (3D) plan view of a top-gate TFT structure 100, in accordance with some embodiments. FIG. 2A illustrates a cross-sectional view of the top-gate thin film transistor structure 100 along the A-A' shown in FIG. 1A, in accordance with some further embodiments. As shown in FIG. 1A, device 100 may include substrate 102, channel 104, doped channel 106, second dielectric 107, gate electrode 110, and spacer materials 114 and 116.

Figure 1B:
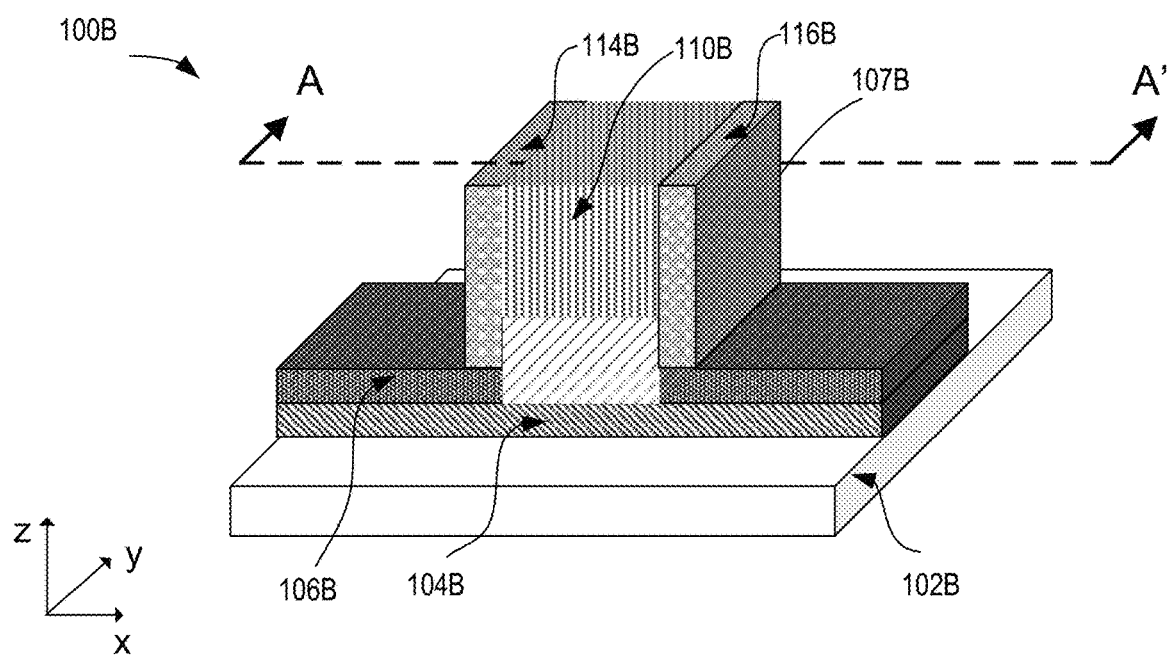
FIG. 1B illustrates a 3D plan view of a top-gate TFT, in accordance with some alternative embodiments.

FIG. 1B illustrates a 3D plan view of a top-gate TFT structure 100, in accordance with some alternative embodiments. As shown in FIG. 1B, device 100B may include substrate 102B, channel 104B, doped channel 106B, second dielectric 107B, gate electrode 110B, and spacer materials 114B and 116B.

Figure 2B:
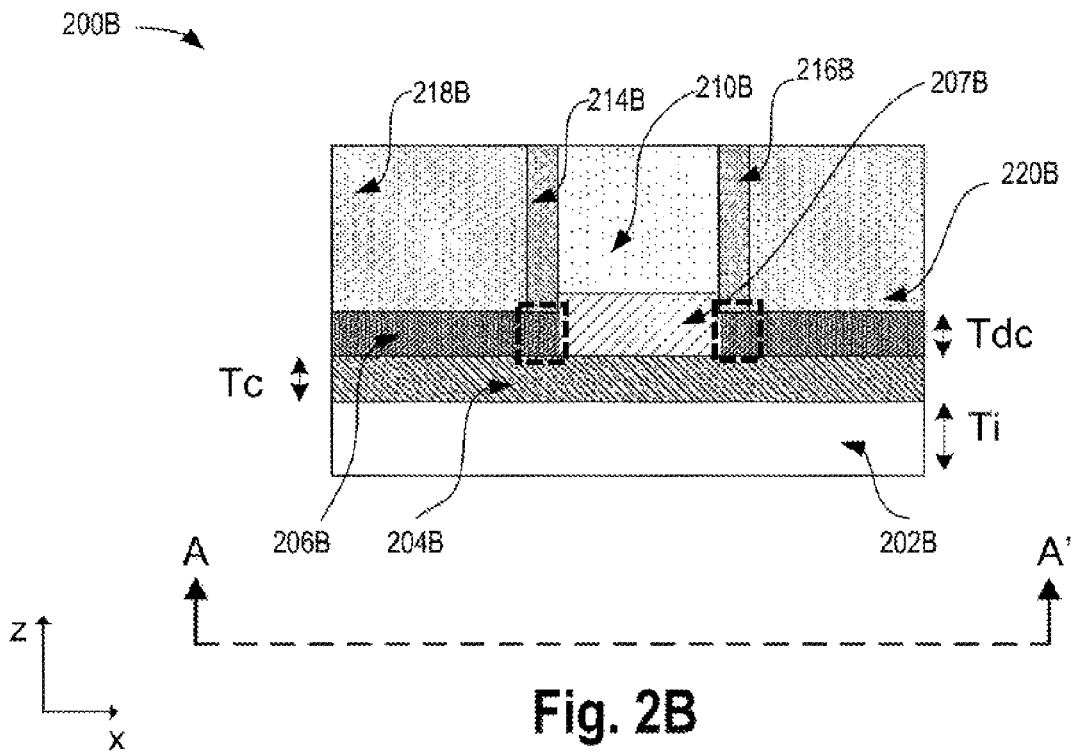
FIG. 2B illustrates a cross-sectional side view of the top-gate TFT structure of FIG. 1, in accordance with some alternative embodiments.
Figure 3L:
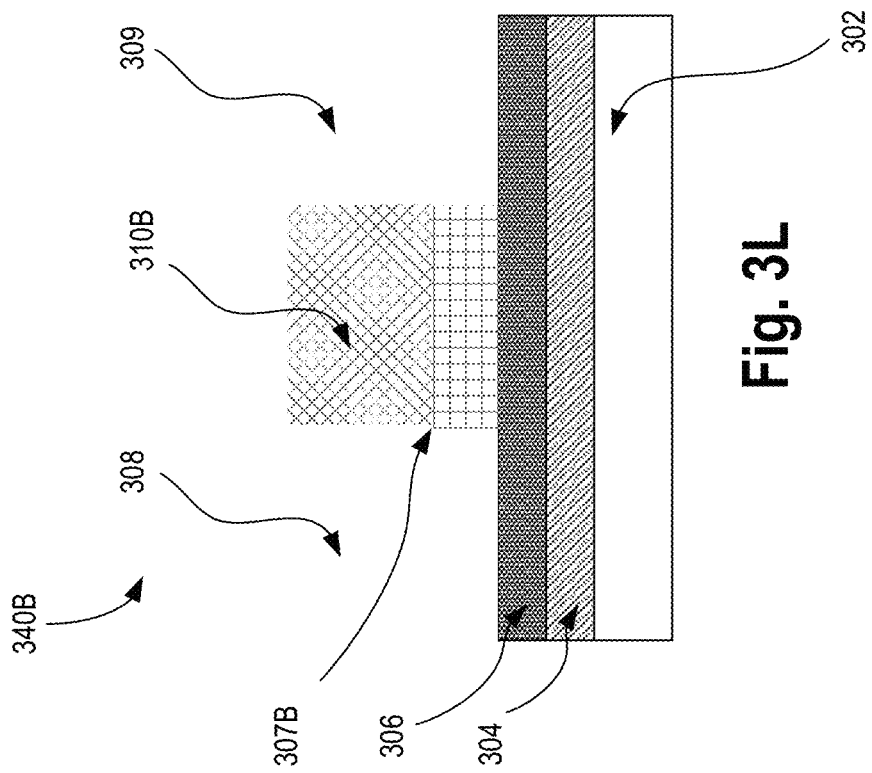
Figure 3K:
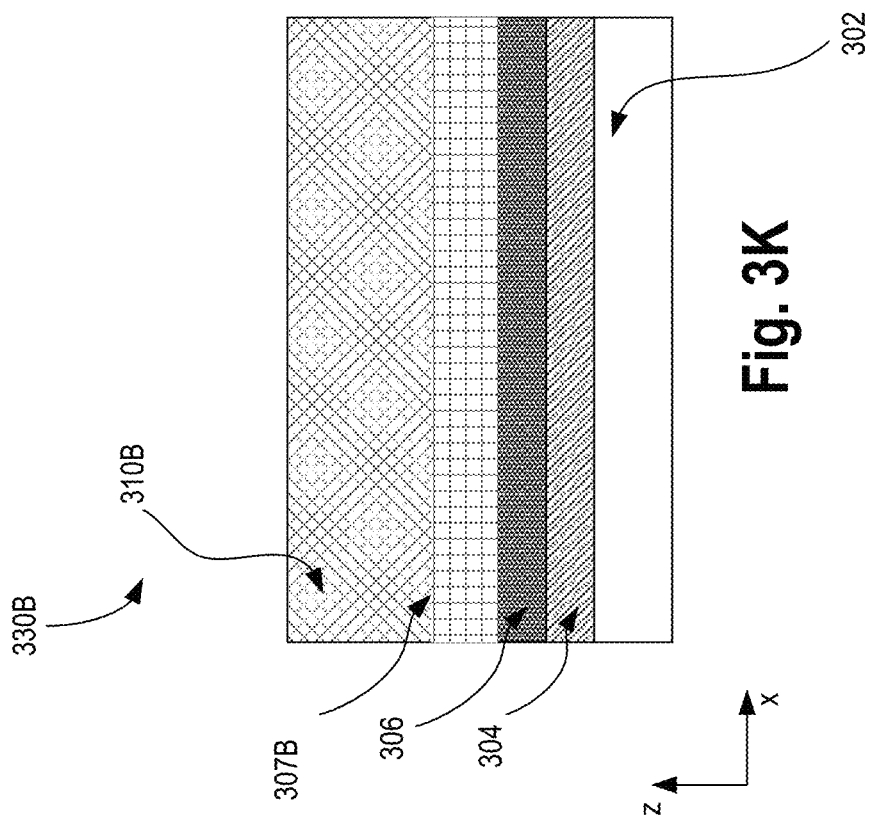
Figure 3P:
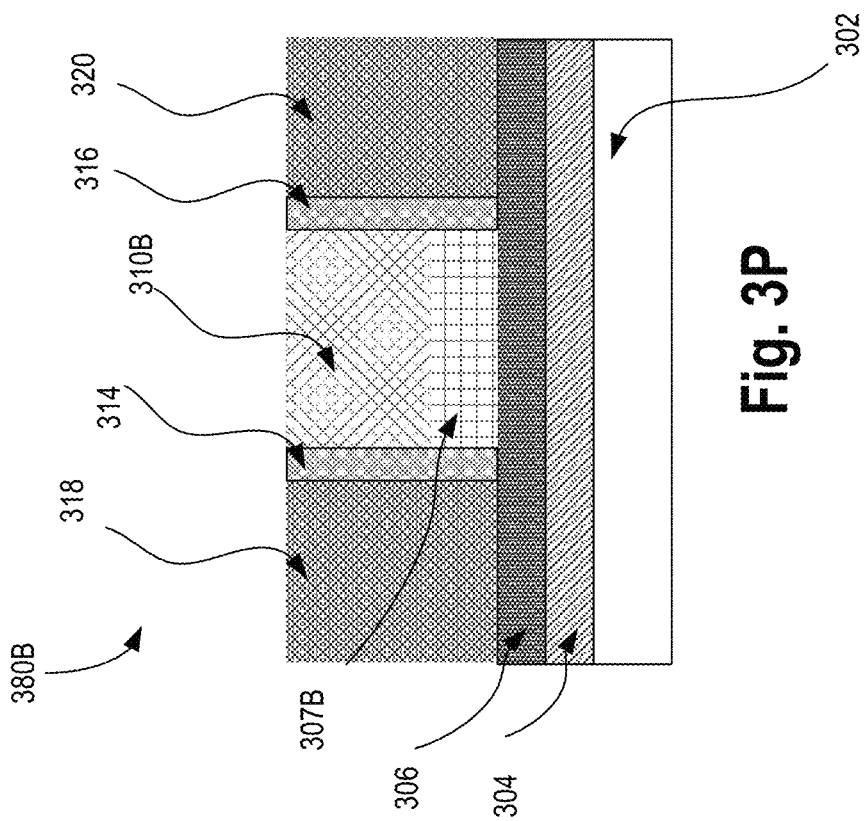
Figure 3O:
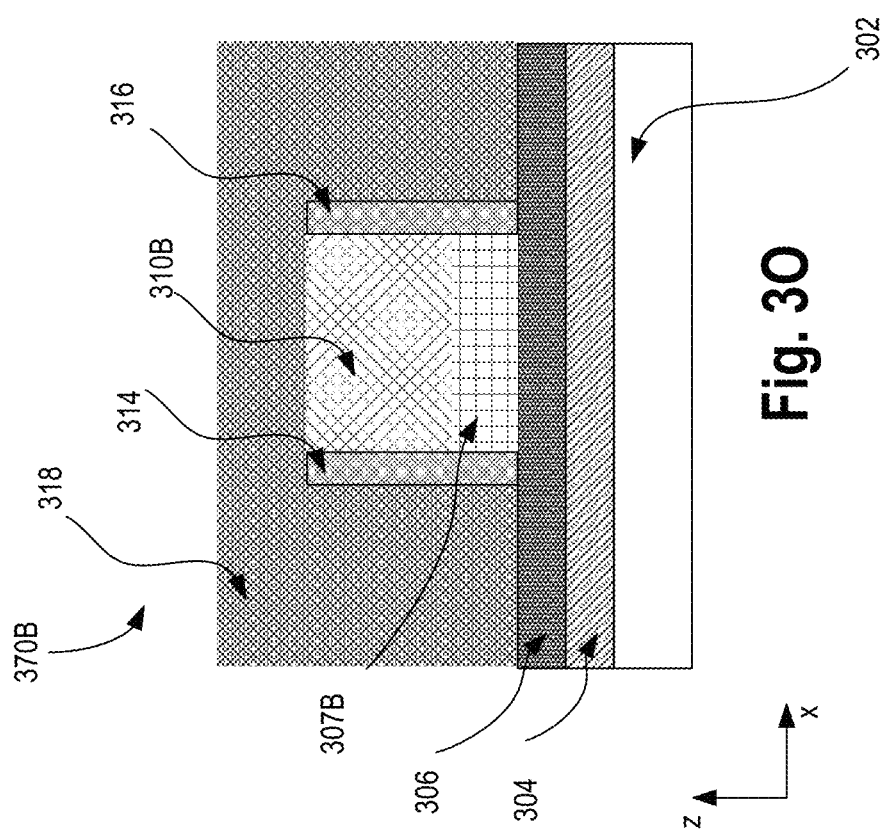
Figure 3R:
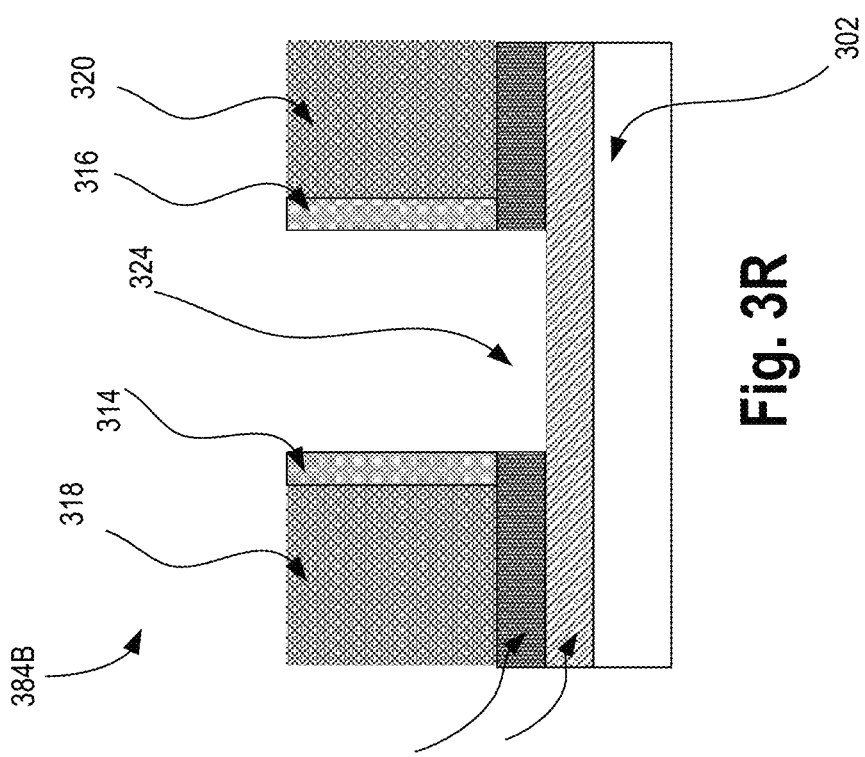
Figure 3Q:
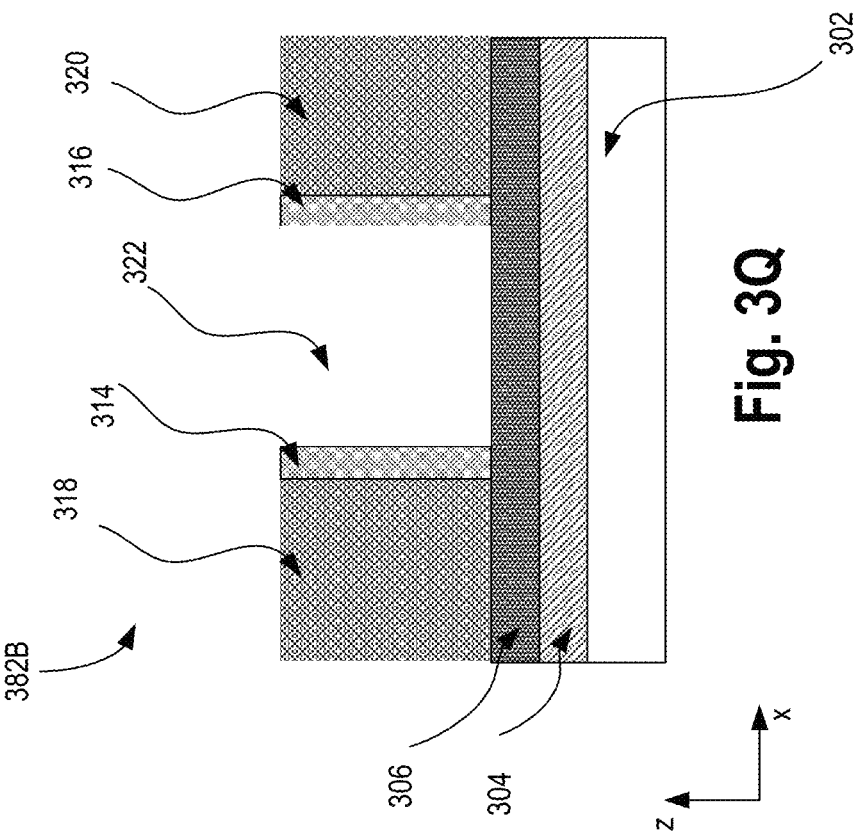

FIGS. 2A and 2B illustrate cross-sectional views of top-gate TFT structure 100 along the A-A' lines illustrated in FIGS. 1A-B, respectively, in accordance with some embodiments. As shown in FIG. 2A, device 200 may include substrate 202, channel 204, doped channel 206, second dielectric 207, gate electrode 210, contact metals 218 and 220, and spacer materials 214 and 216. FIG. 2B illustrates a cross-sectional view of the top-gate thin film transistor structure 100B along the A-A' shown in FIG. 1B, in accordance with some further embodiments.

In some embodiments, substrate 202 is a passivation material. In some embodiments, passivation material is an Interlayer Dielectric (ILD). For example, porous $SiO_2$, fluorine-doped $SiO_2$, carbon-doped $SiO_2$, porous-doped $SiO_2$, spin-on silicon based polymeric dielectric, or spin-on organic polymeric dielectric, can be used as ILD. In some embodiments, the ILD material includes one or more of: Si, O, C, F, Hf, Zr, Al, N, Ta, Ti, Y, or La. In some embodiments, the thickness of the ILD (shown as Ti in FIG. 2A) is less than or equal to 60 nm. ILD are dielectric materials used to electrically separate closely spaced interconnect lines arranged in several levels (multilevel metallization) in an advanced integrated circuit. Typically, ILD features low dielectric constant K (e.g., as close to 1 as possible) to minimize capacitive coupling ("cross talk") between adjacent metal lines.

In some embodiments, the first channel 204 is formed adjacent to the substrate 202. In some embodiments the doped channel 206 is formed adjacent to the first channel 204. In some embodiments the channel 204 and the doped channel 206 include one or more of: In, Ga, Zn, O, Y, Sn, Ge, Si, Mo, Se, W, S, Te, Cu, Co, Nb, Ni, or Al. In some embodiments the channel 204 and the doped channel 206 include one or more of: IGZO, ZnO, Cu2O, CoO, NbO, NiO, SnO, SnO2, Ga2O3, ITO, IZO, AZO, ITZO, ATZO, AIZO, In2O3, MoS2, WSe2, WTe2, MoTe2, black-phosphorus, amorphous/poly/single-crystal Si/Ge/SiGe/III-Vs like-GaN, InGaAs, or InP. In some embodiments, the doped channel 206 is doped with one or more of: N, CHF3, CH3F, Cl2, Cl, F, F2, O2, N2O, NF3, or BCl3. In some embodiments, the doped channel 206 is doped with one or more of: O, F, H, Br, N, C, Cl, or B. Any suitable doping process may be employed, for example to dope the channel 206 described here. In some embodiments, the channel to be formed as a bi-layer with a conductive semiconductor layer of any of the listed channel materials, and wherein the conductive layer in direct contact with the second dielectric 207, contact metals 218 and 220, and spacer materials 214 and 216.

In some embodiments, the channel 204 has a thickness (shown as Tc in FIG. 2A) in a range of 10-1000 Angstrom. In some embodiments, the doped channel 206 has a thickness (shown as Tdc in FIG. 2A) in a range of 10-400 Angstrom. In some embodiments, the doped region has a thickness in a range of 0.5 nm to 5 nm.

In some embodiments, second dielectric 207 is formed adjacent to the doped channel 206. In some embodiments, second dielectric 207 may be a high-K dielectric material which includes one or more of: HfO2, Al2O3, Ta2O5, TiO2, SiN, SiON, SiO2, SiAlOx, HfSiOx, HfAlOx, AlN, ZrOx, HfZrOx, ZrAlOx, SiAlOx, Y2O3, La2O3, HfYOx, HfLaOx, SiOC, SiAlC, SiC, SiAlN, HfTiOx, or AlTiOx. In other embodiments the high-K dielectric material includes one or more of: Hf, Si, O, Zr, Al, N, Ta, Ti, Y, La, or C.

In some embodiments, the gate electrode 210 is formed adjacent to the gate dielectric 207. In some embodiments, the gate electrode 210 includes one or more of: Pt, Ir, Ru, Mo, TaN, ITO, IZO, AZO, TiN, W, TiAlC, TaAlC, Al, WC, Cu, Ta, or Au. In some embodiments, the gate electrode 210 includes one or more of: Ti, N, Ta, W, C, Pt, Cr, Hf, Ir, Ru, Mo, In, O, Al, Zn, Cu, or Au. Each of these metals or metallic compounds may be associated with a particular work function (or metal-semiconductor work function difference) that has an impact transistor threshold voltage. Although gate electrode 210 is illustrated as homogeneous, a stack or laminate of metals may also be employed.

In some embodiments, the spacers 214, 216 are formed partially adjacent to the gate 210 and the gate electric 207. In some embodiments, the spacers include one or more of: HfO2, Al2O3, Ta2O5, TiO2, SiN, SiON, SiO2, SiAlOx, HfSiOx, HfAlOx, AlN, ZrOx, HfZrOx, ZrAlOx, SiAlOx, Y2O3, La2O3, HfYOx, HfLaOx, SiOC, SiAlC, SiC, SiAlN, HfTiOx, or AlTiOx. In some embodiments, the spacers include one or more of: Hf, Si, O, Zr, Al, N, Ta, Ti, Y, La, or C.

In some embodiments, the contacts 218, 220 are formed adjacent to the spacers 214, 216. In some embodiments, the contacts 218 and 220 include one or more of: Pt, Ir, Ru, Mo, TaN, ITO, IZO, AZO, TiN, W, TiAlC, TaAlC, Al, WC, Cu, Ta, or Au. In some embodiments, the contacts 218 and 220 include one or more of: Ti, N, Ta, W, C, Pt, Cr, Hf, Ir, Ru, Mo, In, O, Al, Zn, Cu, or Au. Each of these metals or metallic compounds may be associated with a particular work function (or metal-semiconductor work function difference) that has an impact transistor threshold voltage. Although contacts 218 and 220 are illustrated as homogeneous, a stack or laminate of metals may also be employed.

As shown in FIG. 2B, device 200B may represent an alternative embodiment. As shown in FIG. 2B, device 200B may include substrate 202B, channel 204B, doped channel 206B, second dielectric 207B, gate electrode 210B, contact metals 218B and 220B, and spacer materials 214B and 216B.

In some embodiments, substrate 202B is a passivation material. In some embodiments, passivation material is an Interlayer Dielectric (ILD). For example, porous $SiO_2$, fluorine-doped $SiO_2$, carbon-doped $SiO_2$, porous-doped $SiO_2$, spin-on silicon based polymeric dielectric, or spin-on organic polymeric dielectric, can be used as ILD. In some embodiments, the ILD material includes one or more of: Si, O, C, F, Hf, Zr, Al, N, Ta, Ti, Y, or La. In some embodiments, the thickness of the ILD (shown as Ti in FIG. 2B) is less than or equal to 60 nm.

In some embodiments, the first channel 204B is formed adjacent to the substrate 202B. In some embodiments the doped channel 206B is partially doped and formed adjacent to the first channel 204B. In some embodiments, the channel 204B and the partially doped channel 206B include one or more of: In, Ga, Zn, O, Y, Sn, Ge, Si, Mo, Se, W, S, Te, Cu, Co, Nb, Ni, or Al. In some embodiments, the channel 204B and the partially doped channel 206B include one or more of: IGZO, ZnO, $Cu_2O$, CoO, NbO, NiO, SnO, $SnO_2$, $Ga_2O_3$, ITO, IZO, AZO, ITZO, ATZO, AIZO, $In_2O_3$, $MoS_2$, $WSe_2$, $WTe_2$, $MoTe_2$, black-phosphorus, amorphous/poly/single-crystal Si/Ge/SiGe/III-Vs like-GaN, InGaAs, or InP. In some embodiments, the partially doped channel 206B is doped with one or more of: N, $CHF_3$, $CH_3F$, $Cl_2$, Cl, F, $F_2$, $O_2$, $N_2O$, $NF_3$, or $BCl_3$. In some embodiments, the partially doped channel 206B is doped with one or more of: O, F, H, Br, N, C, Cl, or B. In some embodiments, the channel 204B has a thickness (shown as Tc in FIG. 2B) in a range of 10-1000 Angstrom. In some embodiments, the doped channel 206B has a thickness (shown as Tdc in FIG. 2B) in a range of 10-400 Angstrom. In some embodiments, the doped region has a thickness in a range of 0.5 nm to 5 nm.

In some embodiments, the second dielectric 207B is formed adjacent to the non-doped portion of channel 206B has depicted with the dashed squares in the example case of FIG. 2B). In some embodiments, second dielectric 207B may be a high-K dielectric material which includes one or more of: $HfO_2$, $Al_2O_3$, $Ta_2O_5$, $TiO_2$, SiN, SiON, $SiO_2$, SiAlOx, HfSiOx, HfAlOx, AlN, ZrOx, HfZrOx, ZrAlOx, SiAlOx, $Y_2O_3$, $La_2O_3$, HfYOx, HfLaOx, SiOC, SiAlC, SiC, SiAlN, HfTiOx, or AlTiOx. In other embodiments the high-K dielectric material includes one or more of: Hf, Si, O, Zr, Al, N, Ta, Ti, Y, La, or C.

In some embodiments, the gate electrode 210B is formed adjacent to the gate dielectric 207B. In some embodiments, the gate electrode 210B includes one or more of: Pt, Ir, Ru, Mo, TaN, ITO, IZO, AZO, TiN, W, TiAlC, TaAlC, Al, WC, Cu, Ta, or Au. In some embodiments, the gate electrode 210B includes one or more of: Ti, N, Ta, W, C, Pt, Cr, Hf, Ta, Ir, Ru, Mo, In, 0, Al, Zn, Cu, or Au. Each of these metals or metallic compounds may be associated with a particular work function (or metal-semiconductor work function difference) that has an impact transistor threshold voltage. Although gate electrode 210B is illustrated as homogeneous, a stack or laminate of metals may also be employed.

In some embodiments, the spacers 214B, 216B are formed partially adjacent to the gate 210B and the gate electric 207B. In some embodiments, the spacers include one or more of: $HfO_2$, $Al_2O_3$, $Ta_2O_5$, $TiO_2$, SiN, SiON, $SiO_2$, SiAlOx, HfSiOx, HfAlOx, AlN, ZrOx, HfZrOx, ZrAlOx, SiAlOx, $Y_2O_3$, $La_2O_3$, HfYOx, HfLaOx, SiOC, SiAlC, SiC, SiAlN, HfTiOx, or AlTiOx. In some embodiments, the spacers include one or more of: Hf, Si, O, Zr, Al, N, Ta, Ti, Y, La, or C.

In some embodiments, the contacts 218B, 220B are formed adjacent to the spacers 214B, 216B. In some embodiments, the contacts 218B and 220B include one or more of: Pt, Ir, Ru, Mo, TaN, ITO, IZO, AZO, TiN, W, TiAlC, TaAlC, Al, WC, Cu, Ta, or Au. In some embodiments, the contacts 218B and 220B include one or more of: Ti, N, Ta, W, C, Pt, Cr, Hf, Ta, Ir, Ru, Mo, In, O, Al, Zn, Cu, or Au. Each of these metals or metallic compounds may be associated with a particular work function (or metal-semiconductor work function difference) that has an impact transistor threshold voltage. Although contacts 218B and 220B are illustrated as homogeneous, a stack or laminate of metals may also be employed.

FIGS. 3A-3H illustrate cross-sections 300, 320, 330, 340, 350, 360, 370, and 380, respectively, of materials as a top-gate multilayer TFT is formed, in accordance with some embodiments.

Cross-section 300 illustrates deposition of passivation material 302. In some embodiments, passivation material 302 is an Interlayer Dielectric (ILD). For example, porous $SiO_2$, fluorine-doped $SiO_2$, carbon-doped $SiO_2$, porous-doped $SiO_2$, spin-on silicon based polymeric dielectric, or spin-on organic polymeric dielectric, can be used as ILD. In some embodiments, the ILD material includes one or more of: Si, O, C, F, Hf, Zr, Al, N, Ta, Ti, Y, or La. In some embodiments, the thickness of the ILD (shown as Ti in FIG. 3A) is less than or equal to 60 nm.

Cross-section 320 illustrates disposition of channels 304 and 306. In some embodiments, the channels (or semiconductor bodies) 304 and 306 include one or more of: In, Ga, Zn, O, Y, Sn, Ge, Si, Mo, Se, W, S, Te, Cu, Co, Nb, Ni, or Al. In some embodiments the channel 304 and the doped channel 306 include one or more of: IGZO, ZnO, $Cu_2O$, CoO, NbO, NiO, SnO, $SnO_2$, $Ga_2O_3$, ITO, IZO, AZO, ITZO, ATZO, AIZO, $In_2O_3$, $MoS_2$, $WSe_2$, $WTe_2$, $MoTe_2$, black-phosphorus, amorphous/poly/single-crystal Si/Ge/SiGe/III-Vs like-GaN, InGaAs, or InP. In some embodiments, the channel 306 is doped. In some embodiments, channel 306 is doped with one or more of: N, $CHF_3$, $CH_3F$, $Cl_2$, Cl, F, $F_2$, $O_2$, $N_2O$, $NF_3$, or $BCl_3$. In some embodiments, channel 306 is doped with one or more of: O, F, H, Br, N, C, Cl, or B. Any suitable doping process may be employed, for example to dope the channel 306 described here. In some embodiments, the channel 304 has a thickness (shown as Tc in FIG. 3B) in a range of 10-1000 Angstrom. In some embodiments, the doped channel 306 has a thickness (shown as Tdc in FIG. 3B) in a range of 10-400 Angstrom.

Cross-section 330 illustrates formation of second dielectric 307 and gate layer 310. In various embodiments, TFT formed here is a top-gate TFT where the gate is formed as one of the last structures of the TFT. In some embodiments, the gate comprises a metal. For example, the metal of the gate includes one or more of: Pt, Ir, Ru, Mo, TaN, ITO, IZO, AZO, TiN, W, TiAlC, TaAlC, Al, WC, Cu, Ta, Au. In some embodiments, the metal of the gate includes one or more of: TiN, TaN, Ti, N, Ta, W, C, Pt, Cr, Hf, Ir, Ru, Mo, In, O, Al, Zn, Cu, or Au. In some embodiments, the gate has a thickness (shown as Tg in FIG. 3C) in the range of 5 nm (nanometer) to 20 nm.

In some embodiments, second dielectric 307 comprises a dielectric material. In some embodiments, second dielectric 307 may be a high-K dielectric material which includes one or more of: $HfO_2$, $Al_2O_3$, $Ta_2O_5$, $TiO_2$, SiN, SiON, $SiO_2$, SiAlOx, HfSiOx, HfAlOx, AlN, ZrOx, HfZrOx, ZrAlOx, SiAlOx, Y2O3, La2O3, HfYOx, HfLaOx, SiOC, SiAlC, SiC, SiAlN, HfTiOx, or AlTiOx. In other embodiments the high-K dielectric material includes one or more of: Hf, Si, O, Zr, Al, N, Ta, Ti, Y, La, or C. In some embodiments, second dielectric has a thickness (shown as Tdi in FIG. 3C) in a range of 2 nm to 10 nm.

Cross-section 340 illustrates etching of the gate layer 310 and second dielectric 307 up to layer 306, resulting in openings 308 and 309. Any known methods and techniques can be used to etch the gate layer 310 and second dielectric 307. In some embodiments, a plasma etch is utilized.

Cross-section 350 illustrates the structure of cross-section 340 following a deposition of a dielectric spacer 312 on uppermost surface of layer 306, on sidewalls of gate 310 and second dielectric 307, and on the uppermost surface of gate 310. In some embodiments, dielectric spacer 312 is deposited by an atomic layer deposition (ALD) process to ensure conformal deposition on the deposited surfaces. A conformal deposition process, for example, may provide a film with a uniform thickness at an interface with the sidewalls of gate 310 and second dielectric 307. In some embodiments, the material of spacer 312 includes one or more of: Hf, Si, O, Zr, Al, N, Ta, Ti, Y, La, and C. The dielectric spacer 312 may be deposited to a thickness (shown as Ts in FIG. 3E) in the range of 2 nm-20 nm.

Cross-section 360 illustrates etching of the dielectric spacer 312 over gate 310 and over openings 308 and 309, up to layer 306, leaving dielectric spacers 314 and 316. Any known methods and techniques can be used to etch the dielectric spacer. In some embodiments, a plasma etch is utilized.

Cross-section 370 illustrates the structure of cross-section 360 following the deposition of a contact 318. Any known methods and techniques can be used to deposit the contact 318. In an embodiment, the contact 318 is deposited to a thickness of at least 2.5 times the combined thickness of second dielectric 307 and gate 310 to provide sufficient material for a subsequent planarization process.

Cross-section 380 illustrates the structure of Cross-section 370 following planarization of the contact 318, upper portions of the dielectric spacers 314 and 316 and upper portions of the gate 310. In some embodiments, the planarization process is a chemical mechanical polish (CMP) process. The CMP process is utilized to polish the contact 318, the upper portions of the spacers 314 and 316 and upper portions of the gate 310. Furthermore, in some embodiments, CMP process results in uppermost surfaces of the spacers 314 and 316, gate 310 and the contact 318 and 320 being co-planar or substantially co-planar.

FIGS. 3I-3U illustrate cross-sections 300B, 320B, 330B, 340B, 350B, 360B, 370B, 380B, 382B, 384B, 386B, 388B, and 390B respectively, of materials as a top-gate multilayer TFT is formed, in accordance with some embodiments.

Cross-section 300B illustrates deposition of passivation material 302. In some embodiments, passivation material 302 is an Interlayer Dielectric (ILD). For example, porous $SiO_2$, fluorine-doped $SiO_2$, carbon-doped $SiO_2$, porous-doped $SiO_2$, spin-on silicon based polymeric dielectric, spin-on organic polymeric dielectric, can be used as ILD. In some embodiments, the ILD material includes one or more of: Si, O, C, F, Hf, Zr, Al, N, Ta, Ti, Y, or La. In some embodiments, the thickness of the ILD (shown as Ti in FIG. 3I) is less than or equal to 60 nm.

Cross-section 320B illustrates disposition of channels 304 and 306. In some embodiments, the channels 304 and 306 include one or more of: In, Ga, Zn, O, Y, Sn, Ge, Si, Mo, Se, W, S, or Te, Cu, Co, Nb, Ni, or Al. In some embodiments, the channels 304 and 306 include one or more of: IGZO, ZnO, Cu2O, CoO, NbO, NiO, SnO, SnO2, Ga2O3, ITO, IZO, AZO, ITZO, ATZO, AIZO, In2O3, MoS2, WSe2, WTe2, MoTe2, black-phosphorus, amorphous/poly/single-crystal Si/Ge/SiGe/III-Vs like-GaN, InGaAs, or InP. In some embodiments, the channel 306 is doped. In some embodiments, the doped channel 306 is doped with one or more of: N, CHF3, CH3F, Cl2, Cl, F, F2, O2, N2O, NF3, or BCl3. In some embodiments, the partially doped channel 306 is doped with one or more of: O, F, H, Br, N, C, Cl, or B. Any suitable doping process may be employed, for example to dope the channel 306 described here. In some embodiments, the channel 304 has a thickness (shown as Tc in FIG. 3J) in a range of 10-1000 Angstrom. In some embodiments, the doped channel 306 has a thickness (shown as Tdc in FIG. 3J) in a range of 10-400 Angstrom.

Cross-section 330B illustrates formation of dummy (or sacrificial) second dielectric 307B and dummy gate 310B. In some embodiments, the dummy second dielectric includes a layer of material such as but not limited to silicon dioxide or silicon carbide and the dummy gate material includes a layer of material such as a doped polysilicon. In an embodiment, a resist mask is formed on the layer of dummy gate material.

Cross-section 340B illustrates etching of the dummy gate layer 310B and second dielectric 307B up to layer 306 to form openings 308 and 309. Any known methods and techniques can be used to etch the gate layer 310B and second dielectric 307B. In some embodiments, a plasma etch is utilized.

Cross-section 350B illustrates the structure of cross-section 340 following a deposition of a dielectric spacer 312 on uppermost surface of layer 306, on sidewalls of dummy gate 310B and dummy second dielectric 307B, and on the uppermost surface of dummy gate 310B. In some embodiments, dielectric spacer 312 is deposited by an atomic layer deposition (ALD) process to ensure conformal deposition on the deposited surfaces. A conformal deposition process, for example, may provide a film with a uniform thickness at an interface with the sidewalls of dummy gate 310B and dummy second dielectric 307B. In some embodiments, the material of spacer 312 includes one or more of: Hf, Si, O, Zr, Al, N, Ta, Ti, Y, La, or C. The dielectric spacer 312 may be deposited to a thickness (shown as Ts in FIG. 3M) in the range of 2 nm-20 nm.

Cross-section 360B illustrates etching of the dielectric spacer 312 over dummy gate 310B and over openings 308 and 309, up to layer 306, leaving dielectric spacers 314 and 316. Any known methods and techniques can be used to etch the dielectric spacer. In some embodiments, a plasma etch is utilized.

Cross-section 370B illustrates the structure of cross-section 360B following the deposition of a contact 318. Any known methods and techniques can be used to deposit the contact 318. In an embodiment, the contact 318 is deposited to a thickness of at least 2.5 times the combined thickness of dummy second dielectric 307B and dummy gate 310B to provide sufficient material for a subsequent planarization process.

Cross-section 380B illustrates the structure of Cross-section 370 following planarization of the contact 318, upper portions of the dielectric spacers 314 and 316 and upper portions of the dummy gate 310B. In some embodiments, the planarization process is a chemical mechanical polish (CMP) process. The CMP process is utilized to polish the contact 318, the upper portions of the dielectric spacers 314 and 316 and upper portions of the gate 310B. Furthermore, in some embodiments, CMP process results in uppermost surfaces of the dielectric spacers 314 and 316, dummy gate 310B and the contact 318 and 320 being co-planar or substantially co-planar.

Cross-section 382B illustrates the structure of cross-section 380B following removal of the dummy gate 310B and dummy second dielectric 307B selectively to the dielectric spacers 314 and 316. In some embodiments, dummy gate 310B is removed by an etch process and the dummy second dielectric 307B is removed by a wet process. Any suitable etch process and wet process may be employed, for example to etch the dummy gate 310B and dummy second dielectric 307B described here. As shown, removal of the dummy gate 310B and the dummy second dielectric 307B creates an opening 322.

Cross-section 384B illustrates an embodiment of the structure of cross-section 382B following removal of the doped layer 306 selectively in the opening 322. In some embodiments, doped layer 306 in the opening 322 is selectively removed by a wet etch process. As shown, removal of the doped layer 306 creates an opening 324.

Cross-section 386B illustrates the structure of cross-section 384B following a deposition of a second dielectric on a top surface of layer 304 within opening 324, on sidewalls of dielectric spacers 314 and 316 within opening 322, on top surfaces of dielectric spacers 314 and 316, and on top surfaces of the contact layers 318 and 320. In an embodiment, the second dielectric 326 is deposited by an atomic layer deposition (ALD) process to ensure conformal deposition within openings 322 and 324. A conformal deposition process, for example, may provide a film with a uniform thickness at an interface with layer 304. In some embodiments, second dielectric 326 may be a high-K dielectric material which includes one or more of: HfO2, Al2O3, Ta2O5, TiO2, SiN, SiO2, SiAlOx, HfSiOx, HfAlOx, AlN, ZrOx, HfZrOx, ZrAlOx, SiAlOx, Y2O3, La2O3, HfYOx, SiOC, SiAlC, SiC, SiAlN, HfTiOx, or AlTiOx. In other embodiments, the high-K dielectric material includes one or more of: Hf, Si, O, Zr, Al, N, Ta, Ti, Y, La, or C. The second dielectric 326 may be deposited to a thickness (shown as Tdi in FIG. 3S) in the range of 2 nm-20 nm. A conformal deposition process, such as an ALD process is advantageous when depositing films that are 10 nm or more inside of an opening that ranges between 20 nm-50 nm. In an embodiment, the second dielectric 326 is doped with Si or Co after the deposition process. The doping process may be carried out ex-situ in an implanter for example. In another embodiment, the second dielectric 326 is doped with Si or Co during the deposition process.

In other embodiments, a physical vapor deposition process is utilized to deposit the second dielectric 326. In one such embodiment, the second dielectric 326 is amorphous as deposited on the layer 304 and becomes crystalline after a thermal anneal process at process temperatures of at least 300 degrees Celsius. In an embodiment, an amorphous hafnium oxide film is deposited to a thickness in the range of 10 nm-15 nm and attains a thickness in the range of 8 nm-13 nm (shown as Tdi in FIG. 3S) after a thermal anneal process.

Cross-section 388B illustrates the structure of cross-section 386B following a deposition of a gate electrode layer 328 on the second dielectric 326 in the opening 322. In an embodiment, gate electrode layer 328 is blanket deposited by an atomic layer deposition process (ALD) process to ensure conformal deposition in opening 322 and over the second dielectric 326. In other embodiments, a physical vapor deposition process is utilized. In an embodiment, a gate electrode layer having a crystalline texture is deposited on an amorphous second dielectric 326 and the stack is subjected to a thermal anneal at process temperatures above 300 degrees Celsius.

In some embodiments, depositing gate electrode layer 328 may include depositing a stack of two or more conductive layers, where a first conductive layer that is directly on the second dielectric 326 sets the work function of the gate electrode (to be formed), and the remaining one or more conductive layers include fill layers. The fill layers provide protection to the work function electrode during a subsequent planarization process.

Cross-section 390B illustrates the structure of cross-section 388B following a planarization process to form a gate electrode and second dielectric. In some embodiments, the planarization process includes a CMP process. In some embodiments, the uppermost excess portions of gate electrode layer 328 and second dielectric 326 are removed leaving the gate electrode 330 and second dielectric 326 in the opening 322. In some embodiments, uppermost surfaces of gate electrode 330 and second dielectric 326 are co-planar or substantially co-planar with the uppermost surface of contact layer 318. Co-planarity is advantageous to minimize height variation between transistors and also minimize any potential contact formation issues.

Figure 4A:
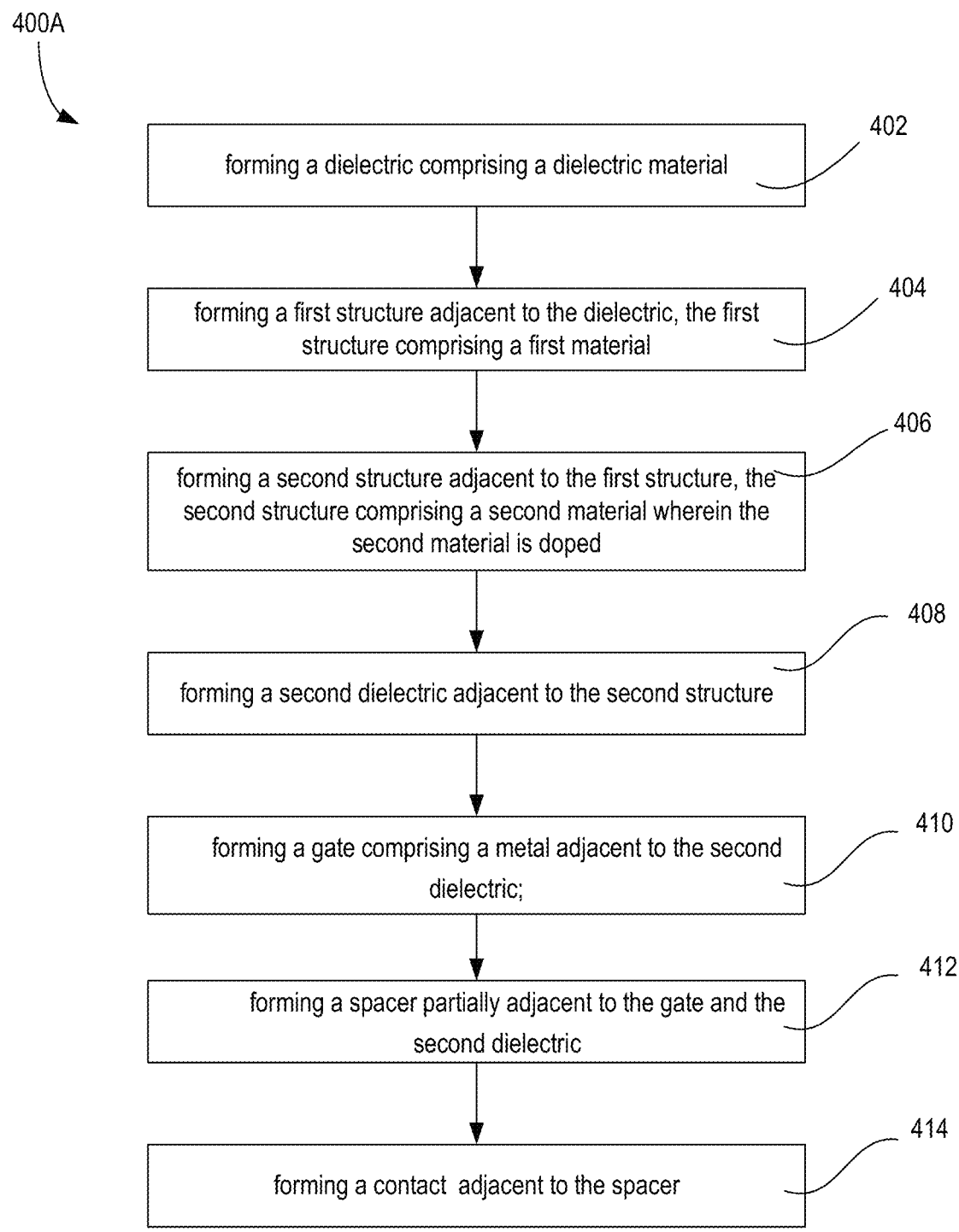
FIG. 4A illustrates a flow diagram illustrating a method for fabricating a top-gate TFT, in accordance with some embodiments.

FIG. 4A illustrates a flowchart 400A illustrating methods for fabricating a top-gated TFT device, in accordance with some embodiments. Flow chart 400A begins at block (or operation) 402 forming a dielectric comprising a dielectric material. In some embodiments, the dielectric is a passivation material. In some embodiments, the passivation material is an Interlayer Dielectric (ILD). For example, porous SiO$_2$, fluorine-doped SiO$_2$, carbon-doped SiO$_2$, porous-doped SiO$_2$, spin-on silicon based polymeric dielectric, or spin-on organic polymeric dielectric, can be used as ILD. In some embodiments, the ILD material includes one or more of: Si, O, C, F, Hf, Zr, Al, N, Ta, Ti, Y, or La. In some embodiments, the thickness of the ILD is less than or equal to 60 nm.

Flowchart 400A continues at operation 404, forming a first structure adjacent to the dielectric, the first structure comprising a first material. In some embodiments, the first material includes one or more of: In, Ga, Zn, O, Y, Sn, Ge, Si, Mo, Se, W, S, Te, Cu, Co, Nb, Ni, or Al. In some embodiments the first material includes one or more of: IGZO, ZnO, Cu2O, CoO, NbO, NiO, SnO, SnO2, Ga2O3, ITO, IZO, AZO, ITZO, ATZO, AIZO, In2O3, MoS2, WSe2, WTe2, MoTe2, black-phosphorus, amorphous/poly/single-crystal Si/Ge/SiGe/III-Vs like-GaN, InGaAs, or InP.

Flowchart 400A continues at operation 406, forming a second structure adjacent to the first structure, wherein the second structure comprises a second material which is doped. In some embodiments, the second material includes one or more of: In, Ga, Zn, O, Y, Sn, Ge, Si, Mo, Se, W, S, Te, Cu, Co, Nb, Ni, or Al. In some embodiments the second material include one or more of: IGZO, ZnO, Cu2O, CoO, NbO, NiO, SnO, SnO2, Ga2O3, ITO, IZO, AZO, ITZO, ATZO, AIZO, In2O3, MoS2, WSe2, WTe2, MoTe2, black-phosphorus, amorphous/poly/single-crystal Si/Ge/SiGe/III-Vs like-GaN, InGaAs, or InP. In some embodiments, the second material is doped with one or more of: N, CHF3, CH3F, Cl2, Cl, F, F2, O2, N2O, NF3, or BCl3. In some embodiments, the second material is doped with one or more of: O, F, H, Br, N, C, Cl, or B.

Flowchart 400A continues at operation 408, forming a second dielectric adjacent to the second structure. In some embodiments, the second dielectric is a high-K dielectric material which includes one or more of: HfO2, Al2O3, Ta2O5, TiO2, SiN, SiON, SiO2, SiAlOx, HfSiOx, HfAlOx, AlN, ZrOx, HfZrOx, ZrAlOx, SiAlOx, Y2O3, La2O3, HfYOx, HfLaOx, SiOC, SiAlC, SiC, SiAlN, HfTiOx, or AlTiOx. In some embodiments, the second dielectric material is a high-K dielectric material which includes one or more of: Hf, Si, O, Zr, Al, or N.

Flowchart 400A continues at operation 410, forming a gate comprising a metal adjacent to the second dielectric. In some embodiments, the metal of the gate includes one or more of: Ti, N, Ta, W, C, Pt, Cr, Hf, Ir, Ru, Mo, In, O, Al, Zn, Cu, or Au.

Flowchart 400A continues at operation 412, forming a spacer partially adjacent to the gate and the second dielectric. In some embodiments, the spacer includes one or more of: Hf, Si, O, Zr, Al, N, Ta, Ti, Y, La, or C.

Flowchart 400A is then completed at operation 414, forming a contact adjacent to the spacer. In some embodiments, the contact includes one or more of: Ti, N, Ta, W, C, Pt, Cr, Hf, Ir, Ru, Mo, In, O, Al, Zn, Cu, or Au.

Figure 4B:
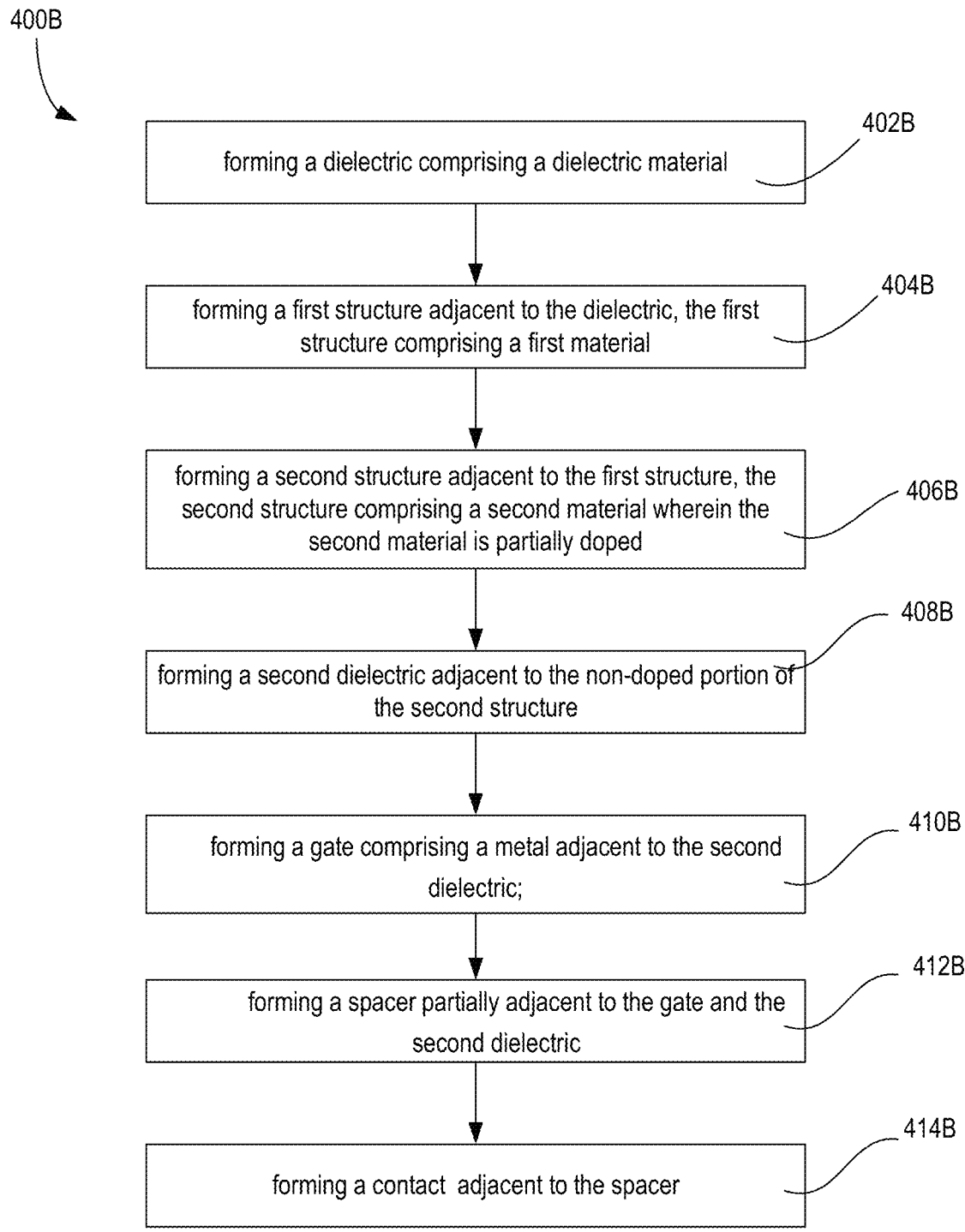
FIG. 4B illustrates a flow diagram illustrating a method for fabricating a top-gate TFT, in accordance with some alternative embodiments.

FIG. 4B illustrates a flowchart 400B illustrating methods for fabricating a top-gated TFT device, in accordance with some other embodiments. Flow chart 400B begins at block (or operation) 402B forming a dielectric comprising a dielectric material. In some embodiments, the dielectric is a passivation material. In some embodiments, the passivation material is an Interlayer Dielectric (ILD). For example, porous $SiO_2$, fluorine-doped $SiO_2$, carbon-doped $SiO_2$, porous-doped $SiO_2$, spin-on silicon based polymeric dielectric, spin-on organic polymeric dielectric, can be used as ILD. In some embodiments, the ILD material includes one or more of: Si, O, C, F, Hf, Zr, Al, N, Ta, Ti, Y, or La. In some embodiments, the thickness of the ILD is less than or equal to 60 nm.

Flowchart 400B continues at operation 404B, forming a first structure adjacent to the dielectric, the first structure comprising a first material. In some embodiments, the first material includes one or more of: In, Ga, Zn, O, Y, Sn, Ge, Si, Mo, Se, W, S, Te, Cu, Co, Nb, Ni, or Al. In some embodiments the first material includes one or more of: IGZO, ZnO, Cu2O, CoO, NbO, NiO, SnO, SnO2, Ga2O3, ITO, IZO, AZO, ITZO, ATZO, AIZO, In2O3, MoS2, WSe2, WTe2, MoTe2, black-phosphorus, amorphous/poly/single-crystal Si/Ge/SiGe/III-Vs like-GaN, InGaAs, or InP.

Flowchart 400B continues at operation 406B, forming a second structure adjacent to the first structure, the second structure comprising a second material wherein the second material is partially doped. In some embodiments, the second material includes one or more of: In, Ga, Zn, O, Y, Sn, Ge, Si, Mo, Se, W, S, Te, Cu, Co, Nb, Ni, or Al. In some embodiments the second material includes one or more of: IGZO, ZnO, Cu2O, CoO, NbO, NiO, SnO, SnO2, Ga2O3, ITO, IZO, AZO, ITZO, ATZO, AIZO, In2O3, MoS2, WSe2, WTe2, MoTe2, black-phosphorus, amorphous/poly/single-crystal Si/Ge/SiGe/III-Vs like-GaN, InGaAs, or InP. In some embodiments, the second material is doped with one or more of: N, CHF3, CH3F, Cl2, Cl, F, F2, O2, N2O, NF3, or BCl3. In some embodiments, the second material is doped with one or more of: O, F, H, Br, N, C, Cl, or B.

Flowchart 400B continues at operation 408B, forming a second dielectric adjacent to the non-doped portion of the second structure. In some embodiments, the second dielectric is a high-K dielectric material which includes one or more of: HfO2, Al2O3, Ta2O5, TiO2, SiN, SiON, SiO2, SiAlOx, HfSiOx, HfAlOx, AlN, ZrOx, HfZrOx, ZrAlOx, SiAlOx, Y2O3, La2O3, HfYOx, HfLaOx, SiOC, SiAlC, SiC, SiAlN, HfTiOx, AlTiOx. In some embodiments, the second dielectric material is a high-K dielectric material which includes one or more of: Hf, Si, O, Zr, Al, N, Ta, Ti, Y, La, or C.

Flowchart 400B continues at operation 410B, forming a gate comprising a metal adjacent to the second dielectric. In some embodiments, the metal of the gate include one or more of: Ti, N, Ta, W, C, Pt, Cr, Hf, Ir, Ru, Mo, In, O, Al, Zn, Cu, or Au.

Flowchart 400B continues at operation 412B, forming a spacer partially adjacent to the gate and the second dielectric. In some embodiments, the spacer includes one or more of: Hf, Si, O, Zr, Al, N, Ta, Ti, Y, La, or C.

Flowchart 400B is then completed at operation 414B, forming a contact adjacent to the spacer. In some embodiments, the contact includes one or more of: Ti, N, Ta, W, C, Pt, Cr, Hf, Ir, Ru, Mo, In, O, Al, Zn, Cu, or Au.

Figure 5:
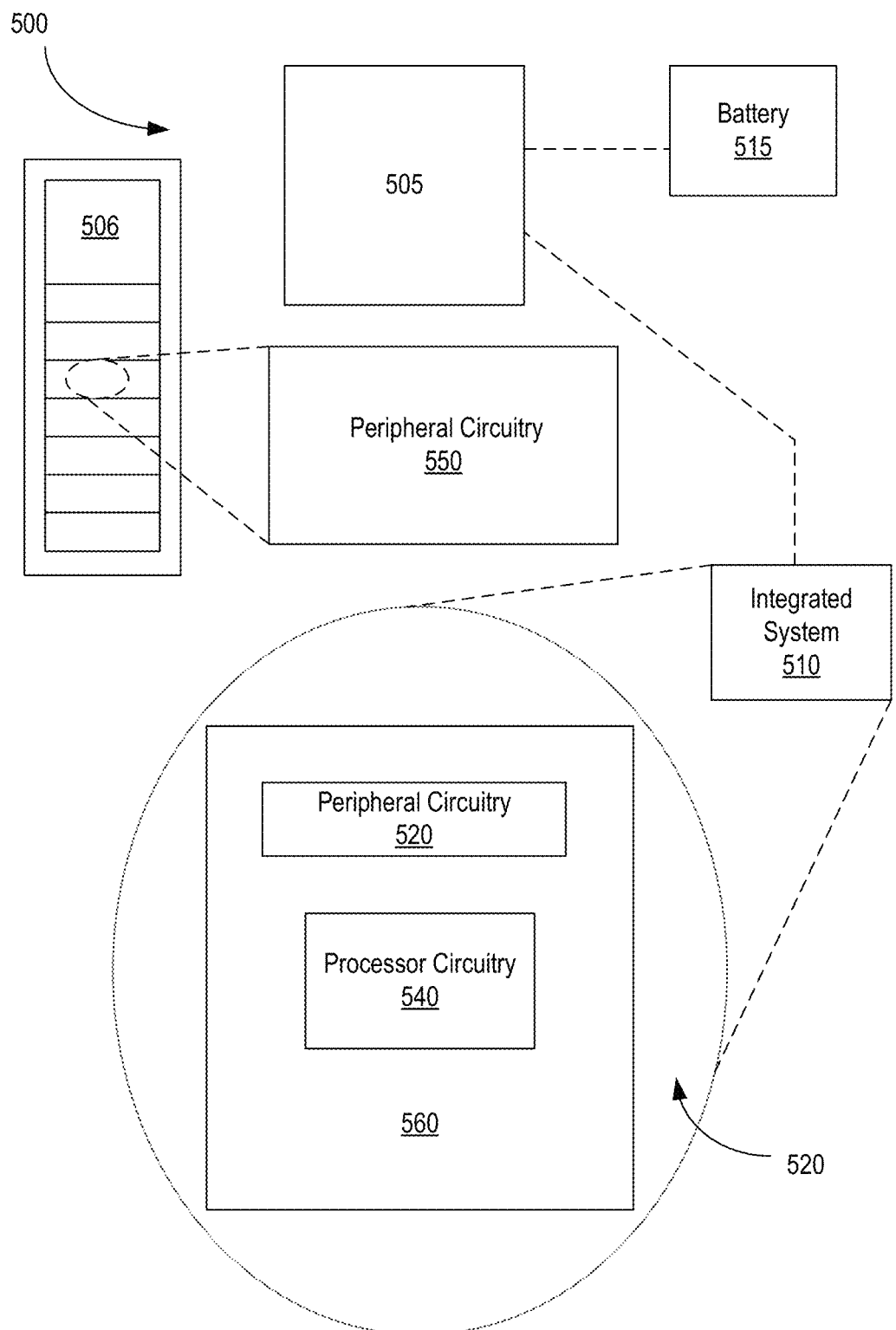
FIG. 5 illustrates a mobile computing platform and a data server machine including top-gate TFTs, in accordance with some embodiments.

FIG. 5 illustrates a mobile computing platform 500 and a data server machine including at least one embedded or integrated top-gated TFT in accordance with some embodiments. In some embodiments, the server machine 506 may be any commercial server, for example including any number of high-performance computing platforms disposed within a rack and networked together for electronic data processing, which in the exemplary embodiment includes a circuitry 550. The mobile computing platform 505 may be any portable device configured for each of electronic data display, electronic data processing, wireless electronic data transmission, or the like, in accordance with some embodiments. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515.

Whether disposed within the integrated system 510 illustrated in the expanded view 520, or as a stand-alone discrete or packaged multi-chip module within the server machine 506, the circuits include at least one top-gate TFT, for example in accordance with some embodiments described elsewhere herein. In some embodiments, disposed within the integrated system 510, a substrate 560 includes a circuitry 520 and processor circuitry 540 (e.g., a microprocessor, a multi-core microprocessor, graphics processor, or the like). In some embodiments, circuitry 520 includes top-gate TFTs, for example as described elsewhere herein. For monolithic embodiments, substrate 560 is a semiconductor chip. In some embodiments, processor circuitry 540, or a separate RFIC chip may be further coupled to an antenna (not shown) to implement any of a number of wireless standards or protocols, including but not limited to Wi-Fi (IEEE 1402.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 6:
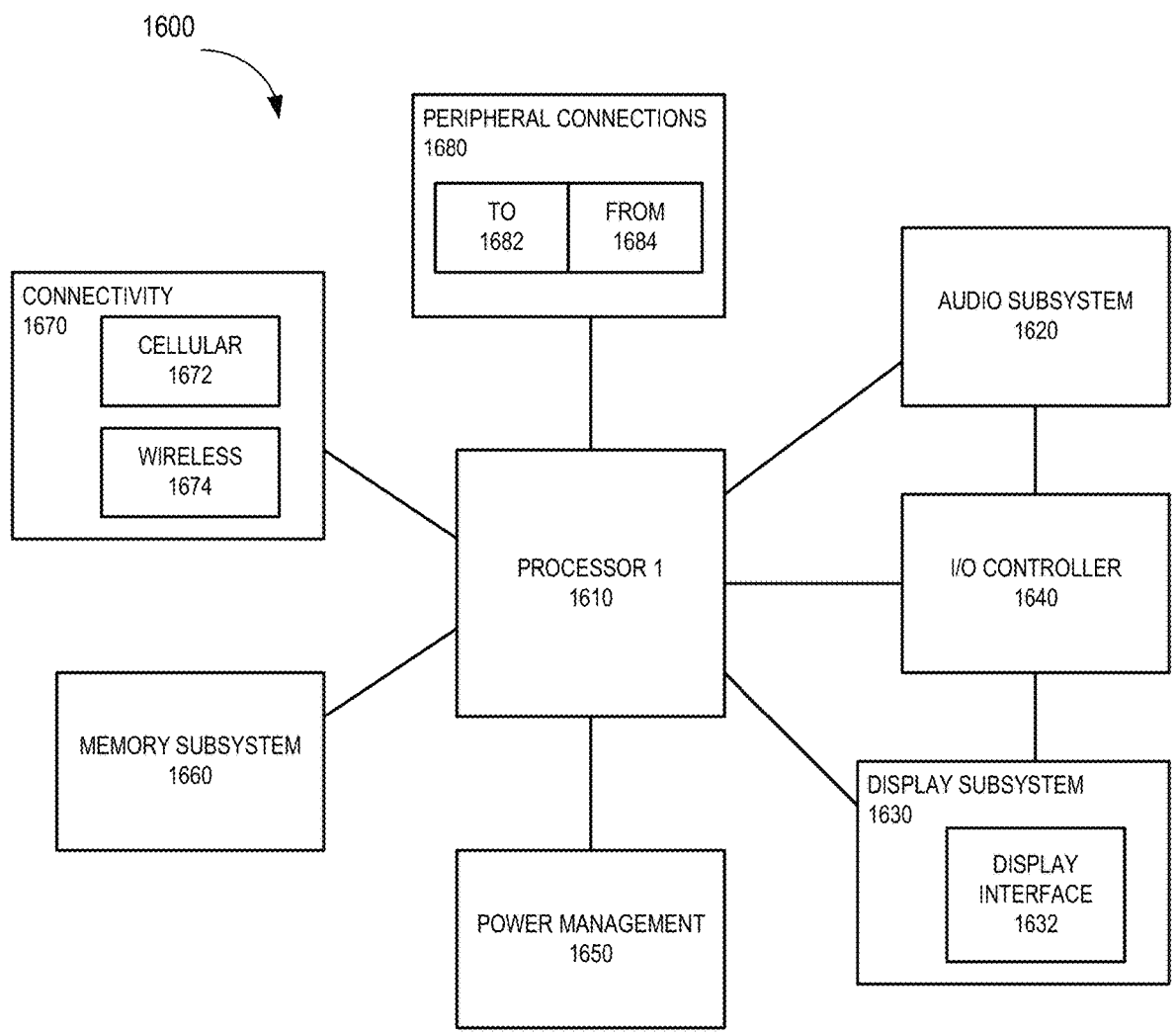
FIG. 6 illustrates a smart device or a computer system or a SoC (System-on-Chip) having top-gate TFTs, according to some embodiments.

FIG. 6 illustrates a smart device or a computer system or a SoC (System-on-Chip) 1600 including top-gate TFTs, according to some embodiments.

For purposes of the embodiments, the transistors for the FEOL in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and Fin-FET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure. In some embodiments, memory cells are formed using top-gate TFTs.

FIG. 6 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600. In some embodiments, one or more blocks (even all blocks) may be powered using the supercapacitor. Any of the blocks of FIG. 6 may comprise a top-gate TFT as discussed with reference to various embodiments.

In some embodiments, computing device 1600 includes first processor 1610 and network interface within 1670 such as a wireless interface so that a system embodiment may be incorporated into a wireless device, for example, cell phone or personal digital assistant. Any of the various blocks of computing device 1600 can have or use the super capacitor of various embodiments.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In some embodiments, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In some embodiments, display interface 1632 includes logic separate from processor 1610 to perform at least some processing related to the display. In some embodiments, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600. In some embodiments, Memory subsystem 1660 includes the scheme of analog in-memory pattern matching with the use of resistive memory elements. In some embodiments, memory subsystem includes the 1T-1C memory using TFTs, according to some embodiments.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "some embodiments," "some embodiments," or "other embodiments" means that a particular feature, structure, or characteristic described in connection with the embodiments is included in at least some embodiments, but not necessarily all embodiments. The various appearances of "an embodiment," "some embodiments," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1. An apparatus comprising: a dielectric comprising a dielectric material; a first structure adjacent to the dielectric, the first structure comprising a first material; a second structure adjacent to the first structure, the second structure comprising a second material wherein the second material is doped; a second dielectric adjacent to the second structure; a gate comprising a metal adjacent to the second dielectric; a spacer partially adjacent to the gate and the second dielectric; and a contact adjacent to the spacer.

Example 2. The apparatus of example 1, wherein the dielectric material includes one or more of: Si, O, C, F, Hf, Zr, Al, N, Ta, Ti, Y, or La.

Example 3. The apparatus of examples 1-2, wherein the first material include one or more of: In, Ga, Zn, O, Y, Sn, Ge, Si, Mo, Se, W, S, Te, Cu, Co, Nb, Ni, or Al.

Example 4. The apparatus of examples 1-3, wherein the second material includes one or more of: In, Ga, Zn, O, Y, Sn, Ge, Si, Mo, Se, W, S, Te, Cu, Co, Nb, Ni, or Al.

Example 5. The apparatus of examples 1-4, wherein the second material is doped with one or more of: O, F, H, Br, N, C, Cl, or B.

Example 6. The apparatus of examples 1-5, wherein the second dielectric is a high-K dielectric material which includes one or more of: $HfO_2$, $Al_2O_3$, $Ta_2O_5$, $TiO_2$, SiN, SiON, $SiO_2$, $SiAlO_x$, $HfSiO_x$, $HfAlO_x$, AlN, $ZrO_x$, $HfZrO_x$, $ZrAlO_x$, $SiAlO_x$, $Y_2O_3$, $La_2O_3$, $HfYO_x$, $HfLaO_x$, SiOC, SiAlC, SiC, SiAlN, $HfTiO_x$, or $AlTiO_x$.

Example 7. The apparatus of examples 1-6, wherein the second dielectric material is a high-K dielectric material which includes one or more of: Hf, Si, O, Zr, Al, N, Ta, Ti, Y, La, or C.

Example 8. The apparatus of examples 1-7, wherein the spacer include one or more of: Hf, Si, O, Zr, Al, N, Ta, Ti, Y, La, or C.

Example 9. The apparatus of examples 1-8, wherein the first structure has a thickness in a range of 10-1000 Angstrom.

Example 10. The apparatus of examples 1-9, wherein the second structure has a thickness in a range of 10-400 Angstrom.

Example 11. The apparatus of examples 1-10, wherein the gate has a thickness in a range of 5 nm to 20 nm.

Example 12. The apparatus of examples 1-11, wherein the metal of the gate includes one or more of: Ti, N, Ta, W, C, Pt, Cr, Hf, Ir, Ru, Mo, In, O, Al, Zn, Cu, or Au.

Example 13. The apparatus of examples 1-12, wherein the contact include one or more of: Ti, N, Ta, W, C, Pt, Cr, Hf, Ir, Ru, Mo, In, O, Al, Zn, Cu, or Au.

Example 14. An apparatus comprising: a dielectric comprising a dielectric material; a first structure adjacent to the dielectric, the first structure comprising a first material; a second structure adjacent to the first structure, the second structure comprising a second material wherein the second material is partially doped; a second dielectric adjacent to the non-doped portion of the second structure; a gate comprising a metal adjacent to the second dielectric; a spacer partially adjacent to the gate and the second dielectric; and a contact adjacent to the spacer.

Example 15. The apparatus of example 14, wherein the dielectric material includes one or more of: Si, O, C, F, Hf, Zr, Al, N, Ta, Ti, Y, or La.

Example 16. The apparatus of examples 14-15, wherein the first material include one or more of: In, Ga, Zn, O, Y, Sn, Ge, Si, Mo, Se, W, S, Te, Cu, Co, Nb, Ni, or Al.

Example 17. The apparatus of examples 14-16, wherein the second material includes one or more of: In, Ga, Zn, O, Y, Sn, Ge, Si, Mo, Se, W, S, Te, Cu, Co, Nb, Ni, or Al.

Example 18. The apparatus of examples 14-17, wherein the second material is doped with one or more of: O, F, H, Br, N, C, Cl, or B.

Example 19. The apparatus of examples 14-18, wherein the second dielectric is a high-K dielectric material which includes one or more of: HfO2, Al2O3, Ta2O5, TiO2, SiN, SiON, SiO2, SiAlOx, HfSiOx, HfAlOx, AlN, ZrOx, HfZrOx, ZrAlOx, SiAlOx, Y2O3, La2O3, HfYOx, HfLaOx, SiOC, SiAlC, SiC, SiAlN, HfTiOx, or AlTiOx.

Example 20. The apparatus of examples 14-19, wherein the second dielectric material is a high-K dielectric material which includes one or more of: Hf, Si, O, Zr, Al, N, Ta, Ti, Y, La, or C.

Example 21. The apparatus of examples 14-20, wherein the spacer includes one or more of: Hf, Si, O, Zr, Al, N, Ta, Ti, Y, La, or C.

Example 22. The apparatus of examples 14-21, wherein the first structure has a thickness in a range of 10-1000 Angstrom.

Example 23. The apparatus of examples 14-22, wherein the second structure has a thickness in a range of 10-400 Angstrom.

Example 24. The apparatus of examples 14-23, wherein the gate has a thickness in a range of 5 nm to 20 nm.

Example 25. The apparatus of examples 14-24, wherein the metal of the gate includes one or more of: Ti, N, Ta, W, C, Pt, Cr, Hf, Ir, Ru, Mo, In, O, Al, Zn, Cu, or Au.

Example 26. The apparatus of examples 14-25, wherein the contact includes one or more of: Ti, N, Ta, W, C, Pt, Cr, Hf, Ir, Ru, Mo, In, O, Al, Zn, Cu, or Au.

Example 27. An electric circuit comprising: one or more transistors; and wherein one or more of the transistors are coupled to a TFT device comprising: a dielectric comprising a dielectric material; a first structure adjacent to the dielectric, the first structure comprising a first material; a second structure adjacent to the first structure, the second structure comprising a second material wherein the second material is doped; a second dielectric adjacent to the second structure; a gate comprising a metal adjacent to the second dielectric; a spacer partially adjacent to the gate and the second dielectric; and a contact adjacent to the spacer.

Example 28. An electric circuit comprising: one or more transistors; and wherein one or more of the transistors are coupled to a TFT device comprising: a dielectric comprising a dielectric material; a first structure adjacent to the dielectric, the first structure comprising a first material; a second structure adjacent to the first structure, the second structure comprising a third material wherein the second material is partially doped; a second dielectric adjacent to the non-doped portion of the second structure; a gate comprising a metal adjacent to the second. dielectric; a spacer adjacent to the gate and the second dielectric; a contact adjacent to the spacer.

Example 29. A method comprising: forming a dielectric comprising a dielectric material; forming a first structure adjacent to the dielectric, the first structure comprising a first material; forming a second structure adjacent to the first structure, the second structure comprising a second material wherein the second material is doped; forming a second dielectric adjacent to the second structure; forming a gate comprising a metal adjacent to the second dielectric; forming a spacer partially adjacent to the gate and the second dielectric; and forming a contact adjacent to the spacer.

Example 30. A method comprising: forming a dielectric comprising a dielectric material; forming a first structure adjacent to the dielectric, the first structure comprising a first material; forming a second structure adjacent to the first structure, the second structure comprising a second material wherein the second material is partially doped; forming a second dielectric adjacent to the non-doped portion of the second structure; forming a gate comprising a metal adjacent to the second dielectric; forming a spacer partially adjacent to the gate and the second dielectric; and forming a contact adjacent to the spacer.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. A top-gate thin film transistor (TFT) comprising:
a first dielectric comprising a dielectric material;
a first layer adjacent to the first dielectric, the first layer comprising a first material;
a second layer adjacent to the first layer, the second layer comprising a second material wherein the second material is partially doped;
a second dielectric laterally adjacent to one or more undoped portions of the second layer;
a gate comprising a metal, wherein the gate is adjacent to the second dielectric;
a spacer adjacent to the gate and the second dielectric; and
a contact adjacent to the spacer.

2. The TFT of claim 1, wherein the dielectric material includes one or more of: Si, O, C, F, Hf, Zr, Al, N, Ta, Ti, Y, or La.

3. The TFT of claim 1, wherein the first and second materials include one or more of: In, Ga, Zn, O, Y, Sn, Ge, Si, Mo, Se, W, S, Te, Cu, Co, Nb, Ni, or Al, and wherein the second material is doped with one or more of: O, F, H, Br, N, C, Cl, or B.

4. The TFT of claim 1, wherein the second dielectric comprises a high-K dielectric material which includes one or more of: HfO2, Al2O3, Ta2O5, TiO2, SiN, SiON, SiO2, SiAlOx, HfSiOx, HfAlOx, AlN, ZrOx, HfZrOx, ZrAlOx, SiAlOx, Y2O3, La2O3, HfYOx, HfLaOx, SiOC, SiAlC, SiC, STAIN, HfTiOx, or AlTiOx.

5. The TFT of claim 1, wherein the second dielectric and spacer include one or more of: Hf, Si, O, Zr, Al, N, Ta, Ti, Y, La, or C.

6. The TFT of claim 1, wherein the first layer has a thickness in a range of 10-1000 Angstroms, and wherein the second layer has a thickness in a range of 10-400 Angstroms, and wherein the gate has a thickness in a range of 5 nm to 20 nm.

7. The TFT of claim 1, wherein the metal of the gate and the contact include one or more of: Ti, N, Ta, W, C, Pt, Cr, Hf, Ir, Ru, Mo, In, O, Al, Zn, Cu, or Au.

8. A top-gate thin film transistor (TFT) comprising:
a first dielectric including a dielectric material;
a first structure adjacent to a top surface of the first dielectric, the first structure comprising a first material;
a second structure adjacent to a top surface of the first structure, the second structure comprising a second material, wherein the second material is partially doped and includes first and second undoped portions;
a second dielectric laterally adjacent to the first and second non-doped portions of the second structure, such that the first and second non-doped portions of the second structure each interface with a sidewall of the second dielectric;
a gate comprising a metal, wherein the gate is adjacent to a top surface of the second dielectric;
a spacer laterally adjacent to the gate and the second dielectric; and
a contact laterally adjacent to the spacer.

9. The TFT of claim 8, wherein the dielectric material includes one or more of:
Si, O, C, F, Hf, Zr, Al, N, Ta, Ti, Y, or La.

10. The TFT of claim 8, wherein the first and second materials include one or more of: In, Ga, Zn, O, Y, Sn, Ge, Si, Mo, Se, W, S, Te, Cu, Co, Nb, Ni, or Al, and wherein the second material is doped with one or more of: O, F, H, Br, N, C, Cl, or B.

11. The TFT of claim 8, wherein the second dielectric comprises a high-K dielectric material which includes one or more of: HfO2, Al2O3, Ta2O5, TiO2, SiN, SiON, SiO2, SiAlOx, HfSiOx, HfAlOx, AlN, ZrOx, HfZrOx, ZrAlOx, SiAlOx, Y2O3, La2O3, HfYOx, HfLaOx, SiOC, SiAlC, SiC, SiAlN, HfTiOx, or AlTiOx.

12. The TFT of claim 8, wherein the second dielectric and spacer include one or more of: Hf, Si, O, Zr, Al, N, Ta, Ti, Y, La, or C.

13. The TFT of claim 8, wherein the first structure has a thickness in a range of 10-1000 Angstroms, and wherein the second structure has a thickness in a range of 10-400 Angstroms, and wherein the gate has a thickness in a range of 5 nm to 20 nm.

14. The TFT of claim 8, wherein the metal of the gate and the contact include one or more of: Ti, N, Ta, W, C, Pt, Cr, Hf, Ir, Ru, Mo, In, O, Al, Zn, Cu, or Au.

15. A system comprising:
a processor;
a memory coupled to the processor, wherein the processor or memory includes:
one or more transistors, wherein one or more of the transistors are coupled to a top-gate thin film transistor (TFT) device comprising:
a first dielectric comprising a dielectric material;
a first structure adjacent to the first dielectric, the first structure comprising a first material;
a second structure adjacent to the first structure, the second structure comprising a second material wherein the second material is partially doped;
a second dielectric laterally adjacent to one or more undoped portions of the second structure;
a gate comprising a metal adjacent to the second dielectric;
a spacer adjacent to the gate and the second dielectric; and
a contact adjacent to the spacer; and
a wireless interface to allow the processor to communicate with another device.

16. The system of claim 15, wherein the dielectric material includes one or more of: Si, O, C, F, Hf, Zr, Al, N, Ta, Ti, Y, or La.

17. The system of claim 15, wherein the first and second materials include one or more of: In, Ga, Zn, O, Y, Sn, Ge, Si, Mo, Se, W, S, Te, Cu, Co, Nb, Ni, or Al, and wherein the second material is doped with one or more of: O, F, H, Br, N, C, Cl, or B.

18. The system of claim 15, wherein the second dielectric comprises a high-K dielectric material which includes one or more of: HfO2, Al2O3, Ta2O5, TiO2, SiN, SiON, SiO2, SiAlOx, HfSiOx, HfAlOx, AlN, ZrOx, HfZrOx, ZrAlOx, SiAlOx, Y2O3, La2O3, HfYOx, HfLaOx, SiOC, SiAlC, SiC, STAIN, HfTiOx, or AlTiOx.

19. The system of claim 15, wherein the second dielectric and spacer include one or more of: Hf, Si, O, Zr, Al, N, Ta, Ti, Y, La, or C.

20. The system of claim 15, wherein the first structure has a thickness in a range of 10 to 1000 Angstroms, wherein the second structure has a thickness in a range of 10 to 400 Angstroms, and wherein the gate has a thickness in a range of 5 nm to 20 nm.

21. The system of claim 15, wherein the metal of the gate and the contact include one or more of: Ti, N, Ta, W, C, Pt, Cr, Hf, Ir, Ru, Mo, In, O, Al, Zn, Cu, or Au.

* * * * *

UNITED STATES PATENT AND TRADEMARK OFFICE
CERTIFICATE OF CORRECTION

PATENT NO. : 11,362,215 B2
APPLICATION NO. : 15/942169
DATED : June 14, 2022
INVENTOR(S) : Abhishek A. Sharma et al.

It is certified that error appears in the above-identified patent and that said Letters Patent is hereby corrected as shown below:

In the Claims

In Claim 4, Column 21, Line 14, please replace "STAIN" with "SiAlN"

In Claim 18, Column 22, Line 46, please replace "STAIN" with "SiAlN"

Signed and Sealed this
Nineteenth Day of July, 2022

Katherine Kelly Vidal
*Director of the United States Patent and Trademark Office*